United States Patent
Tokuyama et al.

(10) Patent No.: US 8,653,652 B2
(45) Date of Patent: Feb. 18, 2014

(54) SEMICONDUCTOR DEVICE, POWER SEMICONDUCTOR MODULE AND POWER CONVERSION DEVICE EQUIPPED WITH POWER SEMICONDUCTOR MODULE

(75) Inventors: Takeshi Tokuyama, Hitachi (JP); Kinya Nakatsu, Hitachinaka (JP); Ryuichi Saito, Hitachi (JP); Toshiya Satoh, Hitachiota (JP); Hideaki Ishikawa, Mito (JP); Nobutake Tsuyuno, Naka-gun (JP); Shigeo Amagi, Naka-gun (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 54 days.

(21) Appl. No.: 13/499,520

(22) PCT Filed: Aug. 24, 2010

(86) PCT No.: PCT/JP2010/064276
§ 371 (c)(1),
(2), (4) Date: Jun. 15, 2012

(87) PCT Pub. No.: WO2011/040153
PCT Pub. Date: Apr. 7, 2011

(65) Prior Publication Data
US 2012/0300522 A1 Nov. 29, 2012

(30) Foreign Application Priority Data
Oct. 2, 2009 (JP) .................. 2009-230136

(51) Int. Cl.
H01L 23/34 (2006.01)
(52) U.S. Cl.
USPC .... 257/722; 257/724; 257/790; 257/E23.101; 257/E23.126; 257/E23.134; 363/131; 363/132

(58) Field of Classification Search
USPC .......... 257/722, 724, 790, E23.101, E23.126, 257/E23.134; 363/131, 132
See application file for complete search history.

(56) References Cited

U.S. PATENT DOCUMENTS 7,504,720 B2  3/2009 Nakatsu et al.
7,791,888 B2 *  9/2010 Tominaga et al. ............ 361/708

(Continued)

FOREIGN PATENT DOCUMENTS

JP   2003-31765 A   1/2003
JP   2006-202899 A  8/2006

(Continued)

OTHER PUBLICATIONS

Corresponding International Search Report with English Translation dated Nov. 30, 2010 (five (5) pages).

*Primary Examiner* — Tu-Tu Ho
(74) *Attorney, Agent, or Firm* — Crowell & Moring LLP

(57) ABSTRACT

A semiconductor device includes: a case with an opening formed thereat; a semiconductor element housed inside the case; a first conductor plate housed inside the case and positioned at one surface side of the semiconductor element; a second conductor plate housed inside the case and positioned at another surface side of the semiconductor element; a positive bus bar electrically connected to the first conductor plate, through which DC power is supplied; a negative bus bar electrically connected to the second conductor plate, through which DC power is supplied; a first resin member that closes off the opening at the case; and a second resin member that seals the semiconductor element, the first conductor plate and the second conductor plate and is constituted of a material other than a material constituting the first resin member.

20 Claims, 24 Drawing Sheets

(56) References Cited

U.S. PATENT DOCUMENTS

| | | | |
|---|---|---|---|
| 8,064,234 B2 | 11/2011 | Tokuyama et al. | |
| 2007/0096278 A1 | 5/2007 | Nakatsu et al. | |
| 2009/0160048 A1 | 6/2009 | Nakatsu et al. | |

FOREIGN PATENT DOCUMENTS

| | | |
|---|---|---|
| JP | 2006-339239 A | 12/2006 |
| JP | 2007-53295 A | 3/2007 |
| JP | 2008-193867 A | 8/2008 |

* cited by examiner

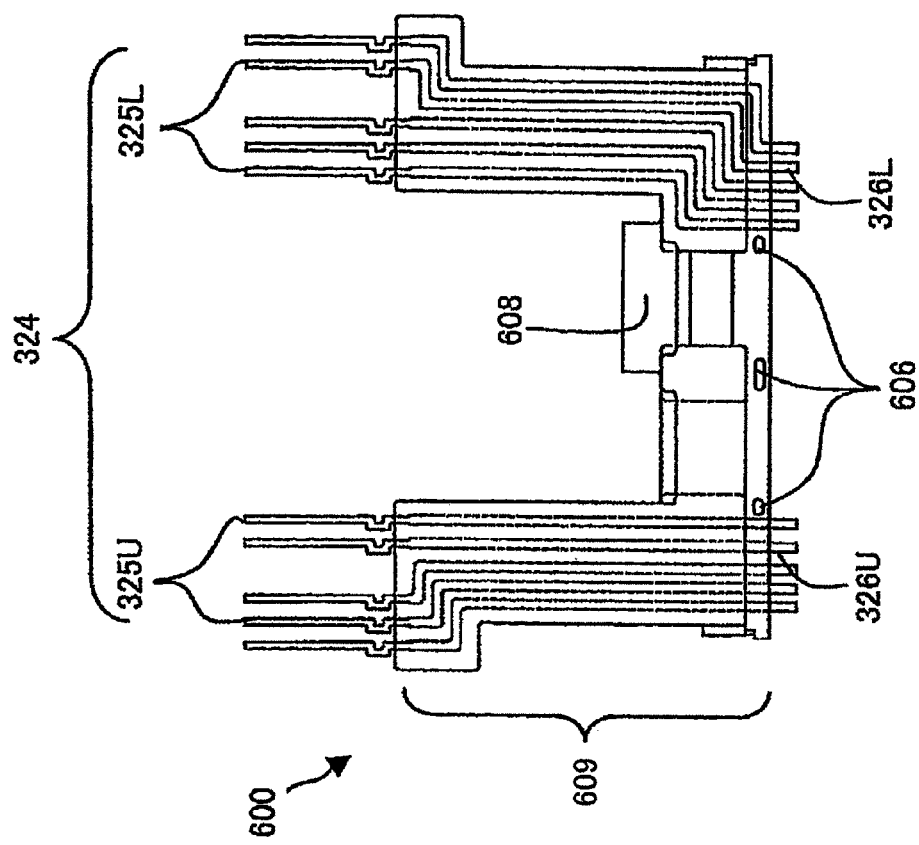
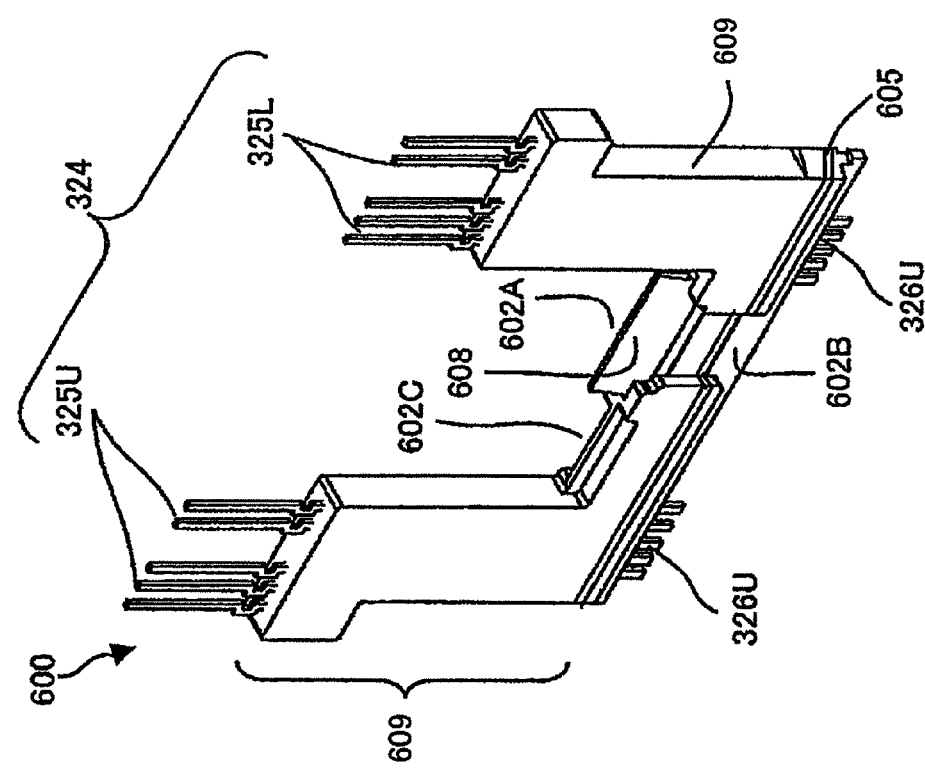
FIG.12

SEMICONDUCTOR DEVICE, POWER SEMICONDUCTOR MODULE AND POWER CONVERSION DEVICE EQUIPPED WITH POWER SEMICONDUCTOR MODULE

TECHNICAL FIELD

The present invention relates to a semiconductor device with a built-in semiconductor element, a power semiconductor module used in an inverter circuit and a power conversion device equipped with the inverter circuit.

BACKGROUND ART

A built-in semiconductor element housed inside a case, disposed in a semiconductor device, is protected from moisture and the like by filling the case with a resin material having an insulating property. A semiconductor device adopting this structure requires a connector terminal, via which the built-in semiconductor element is connected with another electrical component, to be disposed outside the case. The semiconductor device needs to further include a connecting conductor to be used to electrically connect the connector terminal located outside the case with the semiconductor element present within the case. Japanese Laid Open Patent Publication No. 2007-53295 (patent literature 1) and Japanese Laid Open Patent Publication No. 2008-193867 (patent literature 2) each disclose this type of the semiconductor device.

CITATION LIST

Patent Literature

Patent literature 1: Japanese Laid Open Patent Publication No. 2007-53295
Patent literature 2: Japanese Laid Open Patent Publication No. 2008-193867

SUMMARY OF THE INVENTION

Technical Problem

An optimal structure that allows a case to be filled with an insulating resin with ease or an optimal resin filling method needs to be devised in conjunction with this type of semiconductor device with a built-in semiconductor element and the connecting conductor housed inside the case filled with the insulating resin. The productivity of a semiconductor device that better facilitates the resin filling process is bound to improve.

In a power semiconductor module with a built-in power semiconductor element housed in a case, in particular, the current flowing through the power semiconductor element is bound to be significant. For this reason, a connecting conductor that connects the power semiconductor element with the terminal may assume the shape of a plate, i.e., the section of the connecting conductor may assume a substantially rectangular shape. At the same time, the power semiconductor module with the connecting conductor and the power semiconductor element housed therein needs to adopt a structure that facilitates the insulating resin filling process so as to improve the productivity.

An object of the present invention is to provide a semiconductor device or a power semiconductor module assuring outstanding productivity.

Solution to Problem

A semiconductor device according to a 1st aspect of the present invention comprises: a case with an opening formed thereat; a semiconductor element housed inside the case; a first conductor plate housed inside the case and positioned at one surface side of the semiconductor element; a second conductor plate housed inside the case and positioned at another surface side of the semiconductor element; a positive bus bar electrically connected to the first conductor plate, through which DC power is supplied; a negative bus bar electrically connected to the second conductor plate, through which DC power is supplied; a first resin member that closes off the opening at the case; and a second resin member that seals the semiconductor element, the first conductor plate and the second conductor plate and is constituted of a material other than a material constituting the first resin member, wherein: the positive bus bar and the negative bus bar extend from inside the case toward outside the case via the opening, the first resin member fills an area between the positive bus bar and the negative bus bar and the second resin member fills an area between the semiconductor element and the first resin member.

A semiconductor device according to a 2nd aspect of the present invention comprises: a case with an opening formed thereat; a semiconductor element housed inside the case; a first conductor plate housed inside the case and positioned at one surface side of the semiconductor element; a second conductor plate housed inside the case and positioned at another surface side of the semiconductor element; a positive bus bar electrically connected to the first conductor plate, through which DC power is supplied; a negative bus bar electrically connected to the second conductor plate, through which DC power is supplied; and a signal line through which a control signal for controlling the semiconductor element is transmitted, wherein: the positive bus bar, the negative bus bar and the signal line extend from inside the case toward outside the case via the opening at the case; the semiconductor device further comprises a first resin member disposed at the opening of the case so as to close off the opening, with the positive bus bar, the negative bus bar and the signal line supported by the first resin member; and the semiconductor device further comprises a second resin member constituted of a material different from a material constituting the first resin member, which fills an area between the semiconductor element and the first resin member within the case.

According to a 3rd aspect of the present invention, in the semiconductor device according to the 1st or 2nd aspect, it is preferable that the positive bus bar and the negative bus bar are disposed next to each other so as to face opposite each other, and an area between the positive bus bar and the negative bus bar is filled with the first resin member; and the first resin member closing off the opening includes a projection projecting out toward the case with the opening formed thereat.

According to a 4th aspect of the present invention, in the semiconductor device according to the 3rd aspect, a front end of the projection formed at the first resin member, in tight contact with an inner surface of the case, may assume a compressed shape.

According to a 5th aspect of the present invention, in the semiconductor device according to any one of the 1st through 4th aspects, it is preferable that the semiconductor element and the first conductor plate or the semiconductor element and the second conductor plate are electrically connected with each other via a solder layer, and the first resin member is constituted of a material with a fusing temperature higher than a fusing temperature of the solder.

According to a 6th aspect of the present invention, in the semiconductor device according to any one of the 1st through 5th aspects, it is preferable that a fixing portion, which is to fix the first resin member with the second resin member, is disposed at the first resin member on a side toward the semiconductor element, and the fixing portion includes a hole or a recess/protrusion pattern.

A power semiconductor module according to a 7th aspect of the present invention comprises: a power module case that includes a first surface and a second surface facing opposite each other and achieving a large width, and an opening formed at a surface present between the first surface and the second surface; an upper arm switch element and a lower arm switch element housed inside the case, respectively constituting an upper arm circuit and a lower arm circuit of an inverter; a first conductor plate housed inside the case, which is positioned at one surface side of the upper arm switch element and is electrically connected with the one surface of the upper arm switch element; a second conductor plate housed inside the case, which is positioned at another surface side of the lower arm switch element and is electrically connected with the another surface of the lower arm switch element; a first conductor that connects in series the upper arm switch element and the lower arm switch element by electrically connecting another surface of the upper arm switch element and one surface of the lower arm switch element located; a positive bus bar and a negative bus bar through which DC power is supplied to the upper arm switch element and the lower arm switch element connected in series; and a plurality of signal lines through which control signals for controlling the upper arm switch element and the lower arm switch element are transmitted, wherein: the positive bus bar, the negative bus bar and the plurality of signal lines extend from inside the power module case toward outside the power module case via the opening at the power module case; the power semiconductor module further comprises a first mold member constituted of a first resin member and disposed at the opening so as to close off the opening, with the plurality of signal lines being fixed in place with the first mold member, and the positive bus bar and the negative bus bar being supported via the first mold member so as to sustain a positional relationship whereby the positive bus bar and the negative bus bar, disposed next to each other, face opposite each other; and a space unoccupied by the upper arm switch element, the lower arm switch element, the first conductor plate, the second conductor plate and the first conductor is filled with a second resin member constituted of a material different from a material of the first resin member.

According to a 8th aspect of the present invention, in the power semiconductor module according to the 7th aspect, fins for heat dissipation may be provided at outside of the first surface and the second surface of the power module case; and the first conductor plate and the second conductor plate may be disposed inside relative to the first surface and the second surface so as to face opposite the first surface and the second surface respectively, and the first conductor plate and the second conductor plate may be fixed to inner sides of the first surface and the second surface of the power module case via insulating sheets.

According to a 9th aspect of the present invention in the power semiconductor module according to the 7th or 8th aspect, it is preferable that a projection projecting out toward an inner surface of the power module case is formed at an outer side surface of the first mold member facing opposite the inner surface of the power module case.

According to a 10th aspect of the present invention, in the power semiconductor module according to any one of the 7th through 9th aspects, it is preferable that an AC bus bar, which extends from the inside of the power module case through the opening toward the outside of the power module case, is disposed; the AC bus bar is electrically connected with the first conductor via which the upper arm switch element and the lower arm switch element are connected in series; the first conductor plate and the positive bus bar are located on a side toward the first surface of the power module case; the second conductor plate and the negative bus bar are located on a side toward the second surface of the power module case; the power semiconductor module further comprises a third conductor plate and a fourth conductor plate; the first conductor plate and the third conductor plate are disposed so as to face opposite each other across the upper arm switch element; the second conductor plate and the fourth conductor plate are disposed so as to face opposite each other across the lower arm switch element; the first conductor plate and the fourth conductor plate are fixed to an inner side of the first surface of the power module case via an insulating sheet; the second conductor plate and the third conductor plate are fixed to the inner side of the second surface of the power module case via an insulating sheet; and the third conductor plate and the fourth conductor plate are electrically connected with each other via the first conductor.

According to a 11th aspect of the present invention, in the power semiconductor module according to the 10th aspect, the first conductor plate and the fourth conductor plate may be disposed next to each other along a second direction intersecting a first direction along which the positive bus bar or the negative bus bar extends from the inside of the power module to the outside of the power module; and the third conductor plate and the second conductor plate may be disposed next to each other along the second direction.

According to a 12th aspect of the present invention, in the power semiconductor module according to the 11th aspect, the upper arm circuit may include a plurality of upper arm switch elements connected in parallel; the lower arm circuit may include a plurality of lower arm switch elements connected in parallel; the plurality of upper arm switch elements may be disposed next to each other along the second direction between the first conductor plate and the third conductor plate; and the plurality of lower arm switch elements may be disposed next to each other along the second direction between the fourth conductor plate and the second conductor plate.

A power conversion device according to a 13th aspect of the present invention comprises: a cooling unit that forms a flow passage through which a cooling medium flows; a plurality of power semiconductor modules disposed along the flow passage at the cooling unit; and a capacitor module for smoothing, wherein: the power semiconductor modules each comprise: a power module case that includes a first surface and a second surface facing opposite each other and achieving a large width, and an opening formed at a surface present between the first surface and the second surface; an upper arm switch element and a lower arm switch element housed inside the case, respectively constituting an upper arm circuit and a lower arm circuit of an inverter; a first conductor plate housed inside the case, which is positioned at one surface side of the upper arm switch element and is electrically connected with the one surface of the upper arm switch element; a second conductor plate housed inside the case, which is positioned at another surface side of the lower arm switch element and is electrically connected with the another surface of the lower arm switch element; a first conductor that connects in series the upper arm switch element and the lower arm switch element by electrically connecting another surface of the upper arm switch element and one surface of the lower arm switch element; a positive bus bar and a negative bus bar through which DC power is supplied to the upper arm switch element and the lower arm switch element connected in series; and a plurality of signal lines through which control signals for controlling the upper arm switch element and the lower arm switch element are transmitted; the positive bus bar, the negative bus bar and the plurality of signal lines extend from inside the power module case toward outside the power module case via the opening at the power module case; the power semiconductor module further comprises a first mold member constituted of a first resin member and disposed at the opening so as to close off the opening, with the plurality of signal lines being fixed in place with the first mold member and the positive bus bar and the negative bus bar being supported via the first mold member so as to sustain a positional relationship whereby the positive bus bar and the negative bus bar, disposed next to each other, face opposite each other; and a space unoccupied by the upper arm switch element, the lower arm switch element, the first conductor plate, the second conductor plate and the first conductor is filled with a second resin member constituted of a material different from a material of the first resin member.

According to a 14th aspect of the present invention, in the power conversion device according to the 13th aspect, fins for heat dissipation may be provided at outside of the first surface and the second surface of each power module case; and the first conductor plate and the second conductor plate may be disposed inside relative to the first surface and the second surface so as to face opposite the first surface and the second surface respectively, and the first conductor plate and the second conductor plate may be fixed to inner sides of the first surface and the second surface of the power module case via insulating sheets.

According to a 15th aspect of the present invention, in the power conversion device according to the 13th or 14th aspect, it is preferable that a projection projecting out toward an inner surface of the power module case is formed at an outer side surface of the first mold member facing opposite the inner surface of the power module case.

According to a 16th aspect of the present invention, in the power conversion device according to any one of the 7th through 9th aspect, it is preferable that an AC bus bar, which extends from the inside of the power module case through the opening toward the outside of the power module case, is provided; the AC bus bar is electrically connected with the first conductor via which the upper arm switch element and the lower arm switch element are connected in series; the first conductor plate and the positive bus bar are located on a side toward the first surface of the power module case; the second conductor plate and the negative bus bar are located on a side toward the second surface of the power module case; a third conductor plate and a fourth conductor plate are further provided; the first conductor plate and the third conductor plate are disposed so as to face opposite each other across the upper arm switch element; the second conductor plate and the fourth conductor plate are disposed so as to face opposite each other across the lower arm switch element; the first conductor plate and the fourth conductor plate are fixed to an inner side of the first surface of the power module case via an insulating sheet; the second conductor plate and the third conductor plate are fixed to the inner side of the second surface of the power module case via an insulating sheet; and the third conductor plate and the fourth conductor plate are electrically connected with each other via the first conductor.

According to a 17th aspect of the present invention, in the power conversion device according to the 16th aspect, it is preferable that the first conductor plate and the fourth conductor plate are disposed next to each other along a second direction intersecting a first direction along which the positive bus bar or the negative bus bar extends from the inside of the power module to the outside of the power module; and the third conductor plate and the second conductor plate are disposed next to each other along the second direction.

According to a 18th aspect of the present invention, in the power conversion device according to the 17th aspect, the upper arm circuit may include a plurality of upper arm switch elements connected in parallel; the lower arm circuit may include a plurality of lower arm switch elements connected in parallel; the plurality of upper arm switch elements may be disposed next to each other along the second direction between the first conductor plate and the third conductor plate; and the plurality of lower arm switch elements may be disposed next to each other along the second direction between the fourth conductor plate and the second conductor plate.

Advantageous Effect of the Invention

The present invention provides a semiconductor device or a power semiconductor module assuring outstanding productivity by ensuring that the insulating resin can be injected with better ease.

BRIEF DESCRIPTION OF THE DRAWINGS

FIGS. 12(a) and 12(b) show the supplementary mold member included in the other example of a double-sided cooling-type power module in the semiconductor device achieved in the embodiment.

DESCRIPTION OF EMBODIMENTS

The following is a detailed description of a double-sided cooling type power module achieved in an embodiment of the present invention and a power conversion device equipped with this double-sided cooling-type power module, given in reference to drawings. The power conversion device achieved in the embodiment of the present invention may be adopted in a hybrid vehicle or in a pure electric vehicle. The control structure and the circuit structure adopted in the power conversion device achieved in the embodiment of the present invention, included in a hybrid vehicle in a typical example of application, will be described below in reference to FIGS. 1 and 2.

In the example described below, the power conversion device equipped with the power module achieved in the embodiment of the present invention is used as an onboard power conversion device in an electric rotating machine drive system installed in a vehicle and more specifically, as an inverter device engaged in vehicle drive in a vehicle drive electrical machine system, which is bound to be installed and operated in an environment subjected to extreme conditions. A vehicle drive inverter device, included in a vehicle drive electrical machine system, is a control device that controls drive of a vehicle drive dynamo-electric motor by converting DC power provided from an onboard battery constituting an onboard power source or from an onboard power generating device to specific AC power and providing the AC power thus obtained to the vehicle drive dynamo-electric motor. In addition, since the vehicle drive dynamo-electric motor also functions as a generator, the vehicle drive inverter device also further fulfills a function of converting AC power generated at the vehicle drive dynamo-electric motor to DC power in a certain operation mode. The DC power resulting from the conversion is then supplied to the onboard battery.

It is to be noted that while the structure achieved in the embodiment will be best adopted in a vehicle drive power conversion device installed in a car or a truck, it may also be adopted in a power conversion device used in other applications. For instance, it may be adopted in a power conversion device installed in an electric train, a ship, an aircraft or the like, in an industrial power conversion device used as a control device that controls a dynamo-electric motor driving a plant facility, or in a residential power conversion device that functions as a control device for a dynamo-electric motor driving a residential solar power generation system or a residential electric appliance.

First Embodiment

Figure 1:
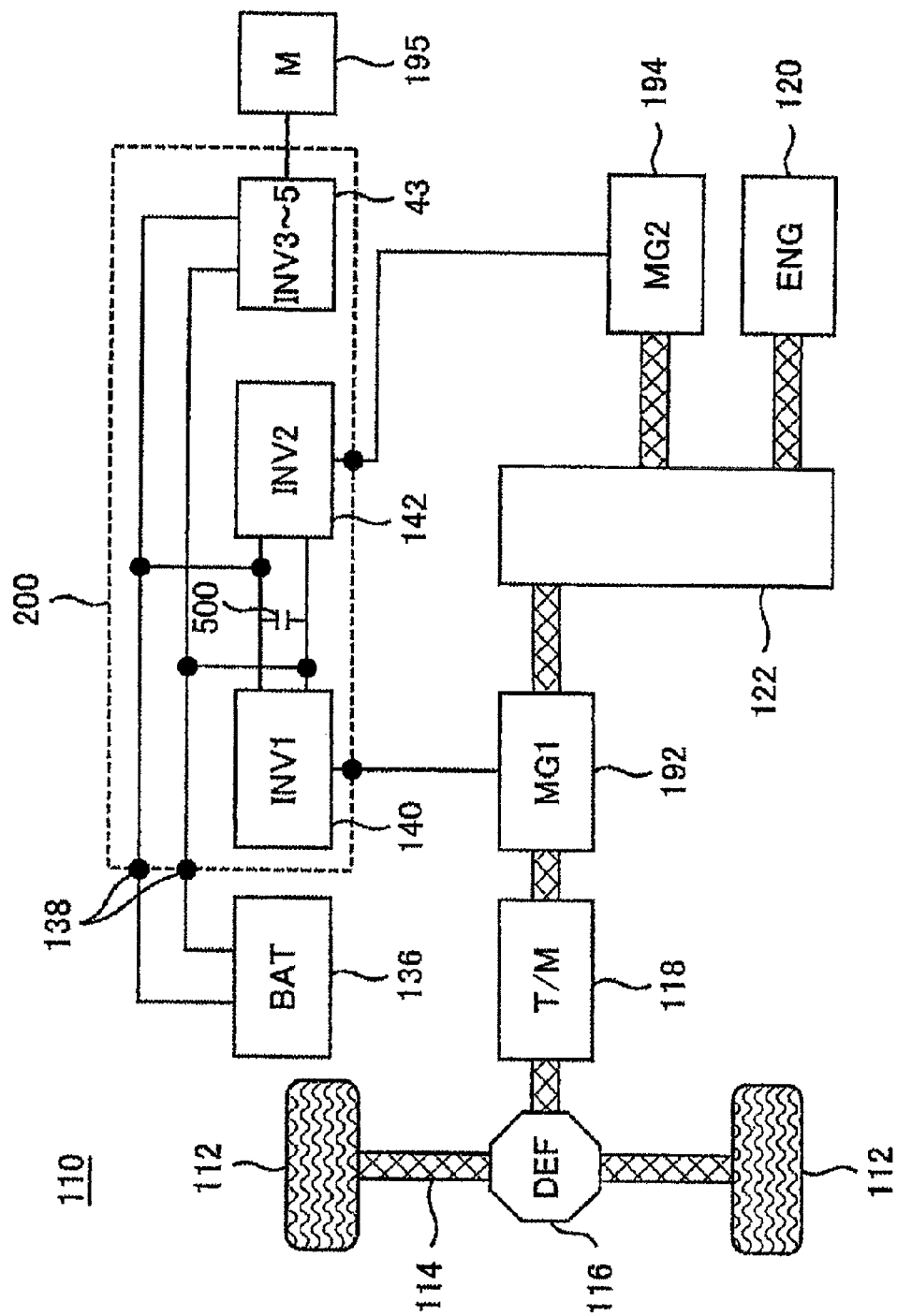
FIG. 1 is a control block diagram related to control of a vehicle equipped with a semiconductor device achieved in an embodiment.

FIG. 1 is a control block diagram pertaining to the control of a hybrid vehicle. A hybrid vehicle (hereafter referred to as an HEV) 110 includes two vehicle drive systems. A first vehicle drive system is an engine drive system that uses an internal combustion engine 120 as a motive power source. The other vehicle drive system is a rotating electrical machine drive system that uses motor generators 192 and 194 as motive power sources. The rotating electrical machine drive system includes drive sources constituted with the motor generators 192 and 194. The motor generators 192 and 194, which may be synchronous machines or induction machines, can be controlled to function as motors or as generators. While the term "motor generator" is used in this description to refer to them fulfilling the dual functions and they are typically engaged in operation as motors and generators, the motor generator 192 or 194 may instead be utilized exclusively as a motor or as a generator. The motor generator 192 or 194 is controlled via an inverter 140 or 142 as explained below and the motor generator 192 or 194 is thus able to operate as a motor or as a generator under the control executed by the corresponding inverter.

While the present invention may be adopted in an HEV such as that shown in FIG. 1, it will be obvious that the present invention may be also adopted in a pure electric vehicle that does not include an engine drive system. The basic operational and structural elements relevant to the present invention remain unchanged whether the present invention is adopted in a rotating electrical machine drive system in an HEV or in a drive system in a pure electric vehicle. Accordingly, for purposes of simplification, the following description is given on an example in which the present invention is adopted in an HEV without making any further reference to an application example in which the present invention is adopted in a pure electric vehicle.

At a front portion of a body, a front wheel axle 114 with a pair of front wheels 112 disposed thereat is axially supported so as to sustain a rotatable state. While the HEV in the embodiment is a front wheel drive vehicle with the front wheels 112 designated as the main wheels, driven by motive power and the rear wheels designated as free wheels, the present invention may be adopted in a rear wheel drive HEV with the drive wheels disposed toward the rear and the free wheels disposed toward the front of the vehicle.

A differential gear unit (hereafter referred to as DEF) 116 is disposed at the front wheel axle 114 which is mechanically connected to the output side of the DEF 116. An output shaft of a transmission 118 is mechanically connected to the input side of the front wheel side DEF 116, which receives a torque, having undergone speed change via the transmission 118 and distributes the torque to the left side and the right side of the front wheel axle 114. The output side of the motor generator 192 is mechanically connected to the input side of the transmission 118. The output side of the engine 120 or the output side of the motor generator 194 is mechanically connected, via a motive power distribution mechanism 122, to the input side of the motor generator 192. It is to be noted that the motor generators 192 and 194 and the motive power distribution mechanism 122 are housed inside a casing of the transmission 118.

While the motor generators 192 and 194 may be induction machines, the motor generators 192 and 194 in the embodiment are each constituted with a synchronous machine with permanent magnets embedded at a rotor, which assures better efficiency. As AC power supplied to stator coils included in the stators of the induction machines or synchronous machines is controlled by the inverter circuit units 140 and 142, the operations of the motor generators 192 and 194 as motors or generators and their operational characteristics are controlled. A battery 136 is connected to the inverter circuit units 140 and 142 and thus, power can be exchanged between the battery 136 and the inverter circuit units 140 and 142.

The HEV 110 in the embodiment includes two motor generator units, i.e., a first motor generator unit constituted with the motor generator 192 and the inverter circuit unit 140 and a second motor generator unit constituted with the motor generator 194 and the inverter circuit unit 142. The individual motor generator units are selectively engaged in operation depending upon operating conditions. Namely, in order to supplement the vehicle drive torque while the vehicle is driven with motive power provided from the engine 120, the second motor generator unit is engaged in operation as a generator unit with the motive power from the engine 120 so as to generate power and the first motor generator unit is engaged in operation as a (electric) motor unit with the power obtained through the power generation. In order to boost acceleration under similar circumstances, the first motor generator unit is engaged in operation as a generator unit with motive power from the engine 120 so as to generate power and the second motor generator unit is engaged in operation as a (electric) motor unit with the power obtained through the power generation.

In addition, the vehicle can be driven entirely on the motive power provided from the motor generator 192 by engaging the first motor generator unit in operation as a motor unit with electric power from the battery 136 in the embodiment. Moreover, the battery 136 in the embodiment can be charged by engaging the first motor generator unit or the second motor generator unit in operation as a generator unit so as to generate power with motive power from the engine 120 or motive power imparted from the wheels.

The battery 136 is also used as a power source that provides power used to drive an auxiliary motor 195. Such an auxiliary motor may drive, for instance, a compressor in the air-conditioning system or a hydraulic pump in a control system. DC power provided from the battery 136 to an auxiliary inverter device 43 is converted to AC power at the converter device 43 used in conjunction with the auxiliary motor and the AC power resulting from the conversion is then provided to the motor 195. The auxiliary converter device 43, having functions similar to those of the inverter circuit units 140 and 142, controls the phase, the frequency and the power level of the AC power to be provided to the motor 195. For instance, as AC power is supplied to the motor 195, it generates torque assuming a phase more advanced relative to the rotation of the rotor at the motor 195. As the converter device 43 generates AC power with a retarded phase, the motor 195 is engaged in operation as a generator and operates in a regenerative braking state. The control functions of this auxiliary converter 43 are similar to the control functions of the inverter circuit units 140 and 142. While the maximum power conversion capability of the auxiliary converter device 43, the capacity of which is smaller than that of the motor generators 192 and 194, is smaller than the maximum power conversion capability of the inverter circuit units 140 and 142, the auxiliary converter device 43 adopts a circuit structure that is basically identical to the circuit structure of the inverter circuit units 140 and 142.

While the illustration of the embodiment provided in FIG. 1 does not include a constant voltage source, various control circuits and various types of sensors operate on electric power provided from the constant voltage source (not shown). This constant voltage source may be, for instance, a 14V power source equipped with a 14V lead battery. It may instead be a power source that includes a 14V battery. Either the positive electrode or the negative electrode of the battery is connected to the body, which functions as a power supply conductor for the constant voltage source.

The inverter circuit units 140, 142 and 43 are electrically in a close relationship with a capacitor module 500. In addition, they all share a common need for effective measures against heat generated thereat. They also need to be provided as units achieving device volume minimization. Accordingly, a power conversion device 200 is configured by housing the inverter circuit units 140, 142 and 43 and the capacitor module 500 in the casing of the power conversion device 200, as will be described in detail later. This configuration allows the power conversion device 200 to be provided as a more compact unit. The structure has further advantages in that it requires a smaller number of harnesses and makes it possible to reduce radiation noise or the like. These advantages, leading to further miniaturization, are also bound to improve the reliability and productivity. Furthermore, since the length of the circuit path connecting the capacitor module 500 with the inverter circuit units 140, 142 and 43 can be reduced or the structure to be described below can be adopted, the inductance can be reduced, which, in turn, will lead to a reduction in spike voltage. The structure to be described below will also lead to a reduction in heat generation and an improvement in heat dissipation efficiency.

(Structure of the Power Conversion Device)

Figure 2:
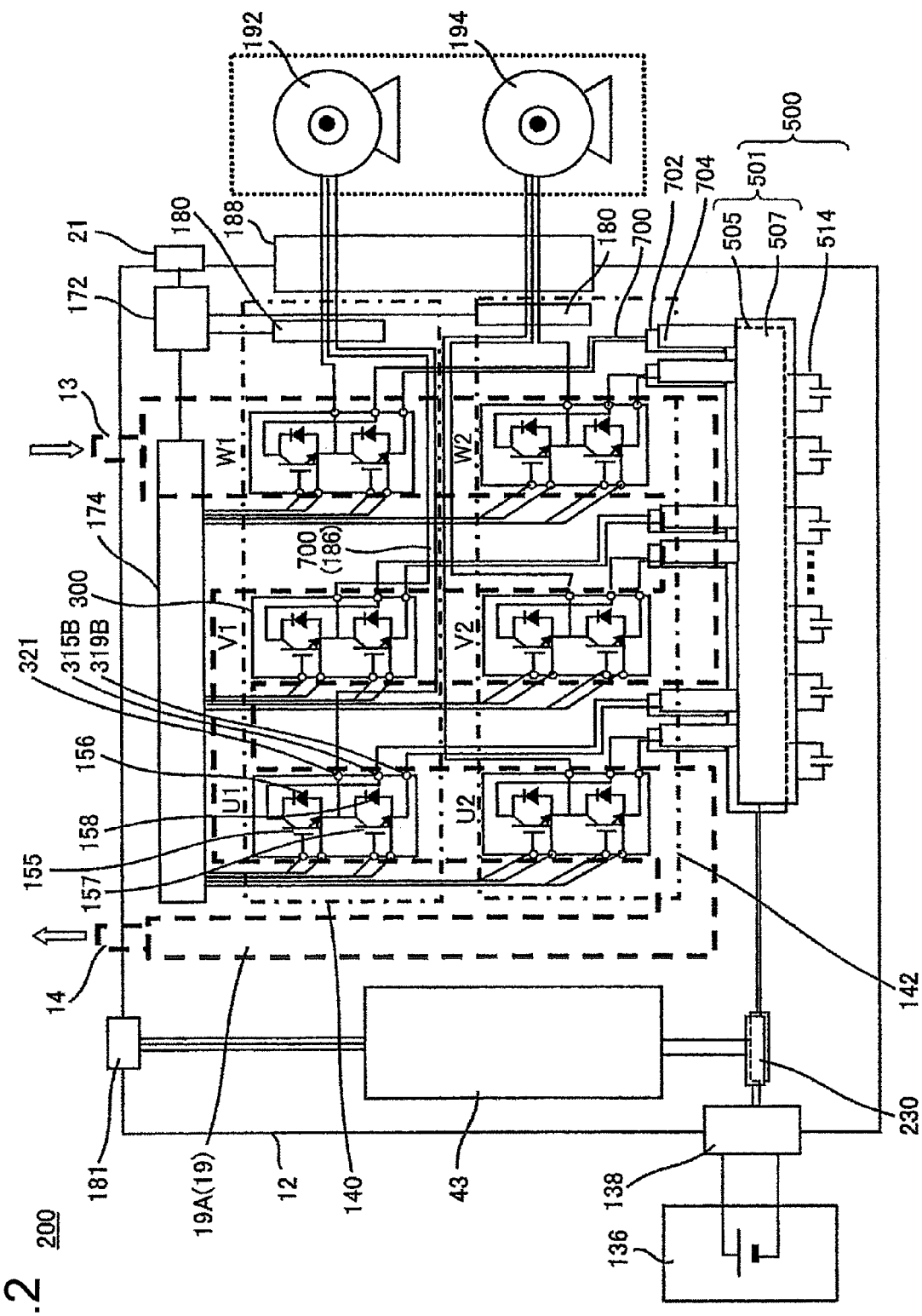
FIG. 2 shows a power conversion circuit in the semiconductor device achieved in the embodiment.

In reference to FIG. 2, the circuit structure of the power conversion device 200 is described. As shown in FIG. 1, the power conversion device 200 includes the inverter circuit units 140 and 142, the auxiliary conversion device 43 and the capacitor module 500. The auxiliary converter device 43 is an inverter device that controls an auxiliary unit drive motor used to drive auxiliary devices installed in the vehicle. As an alternative, a DC-DC converter, functioning as a voltage booster/reducer that boosts the voltage provided to the battery 136 in FIG. 1 or reduces a high-voltage to the voltage level required of the voltage to be provided to the battery 136, may be used as the auxiliary converter device 43.

The inverter circuit units 140 and 142 each include a plurality of power semiconductor modules 300 (three power semiconductor modules 300 in this embodiment) adopting a double-sided cooling structure. By connecting the power semiconductor modules 300, a three-phase bridge circuit is configured. In order to achieve a greater current capacity, an additional power semiconductor module 300 may be connected in parallel in correspondence to each phase in the three-phase inverter circuit. In addition, by connecting in parallel the semiconductor elements built into the power semiconductor module 300 as described below, the capacity for greater power can be assured without having to connect an additional power semiconductor module 300 in parallel.

As will be described later, the power semiconductor modules 300 each include power semiconductor elements and connection wiring used to connect them housed inside a module case 304 shown in FIGS. 3(*a*) and 3(*b*). The module case 304 achieved in the embodiment in FIGS. 3(*a*) and 3(*b*) includes a canister-shaped base constituted of a heat radiating metal material with an opening formed thereat. The module case 304, which includes heat radiating bases 307 facing opposite each other, shields five surfaces of the semiconductor module 300 except for the surface where the opening is present. An outer wall formed with a single material and ranging seamlessly is formed continuously to the two heat radiating bases 307 having the largest areas so as to cover the five surfaces, thereby connecting the surfaces where the two heat radiating bases 307 are located. Through the opening formed at one surface of the canister-shaped module case 304 formed to achieve a substantially rectangular parallelopiped shape, the power semiconductor elements are inserted and held inside the module case 304.

The drive of the inverter circuit units 140 and 142 is controlled by two driver circuits included in a control unit. It is to be noted that FIG. 2 shows a driver circuit 174 representing the two driver circuits. The two driver circuits are each controlled by a control circuit 172 which generates a switching signal used to control the timing with which the power semiconductor elements are switched.

Since the inverter circuit unit 140 and the inverter circuit unit 142 are basically identical in both circuit structure and in control and operation, the following explanation will be given by focusing on the inverter circuit unit 140, chosen as a typical example. The inverter circuit unit 140 is basically configured as a three-phase bridge circuit. In more specific terms, arm circuits engaged in operation as a U-phase arm circuit (notated as U1), a V-phase arm circuit (notated as V1) and a W-phase arm circuit (notated as W1) are each connected in parallel to a positive conductor and a negative conductor through which DC power is supplied. It is to be noted that the arm circuits engaged in operation as a U-phase arm circuit, a V-phase arm circuit and a W-phase arm circuit in the inverter circuit unit 142 are respectively notated as U2, V2 W2 in correspondence to the individual arm circuits in the inverter circuit unit 140.

Each arm circuit corresponding to a specific phase is configured as an upper/lower arm serial circuit formed by connecting in series an upper arm circuit and a lower arm circuit, with the upper arm circuit connected to the positive conductor and the lower arm circuit connected to the negative conductor. AC power is generated at the connecting area where the upper arm circuit and the lower arm circuit are connected with each other, and the connecting area where the upper arm circuit and the lower arm circuit connect with each other in each upper/lower arm serial circuit is connected to an AC terminal 321 of the particular power semiconductor module 300. The AC terminals 321 in the individual power semiconductor modules 300, corresponding to the various phases are each connected to an AC output terminal of the power conversion device 200 and the AC power having been generated is thus provided to a stator coil of the motor generator 192 or 194. The power semiconductor modules 300 corresponding to the various phases are basically identical in both structure and in control and operation. Accordingly, the following description is given by focusing on the power module U1, i.e., the U-phase power semiconductor module 300, chosen as a typical example.

The upper arm circuit in the embodiment includes an upper arm IGBT 155 (insulated gate bipolar transistor) to be engaged in operation as a switching power semiconductor element, and an upper arm diode 156. The lower arm circuit in the embodiment includes a lower arm IGBT 157 (insulated gate bipolar transistor) to be engaged in operation as a switching power semiconductor element, and a lower arm diode 158. A DC positive terminal 315B and a DC negative terminal 319B in the upper/lower arm serial circuit are each connected to a DC terminal at the capacitor module 500 used to establish capacitor connection, and the AC power supplied via_the AC terminal 321 is provided to the motor generator 192 or 194.

The IGBTs 155 and 157 are engaged in switching operation in response to a drive signal output from either one of the two driver circuits constituting the drive circuit 174 and the DC power provided from the battery 136 is converted to three-phase AC power through the switching operation. The power resulting from the conversion is provided to the stator coil of the motor generator 192. It is to be noted that reference numerals 155, 157, 156 and 158 are not appended to the circuit elements in the V-phase circuit and the W-phase circuit, since they adopt circuit structures substantially identical to that of the U-phase circuit. The power semiconductor modules 300 in the inverter circuit unit 142 are structured similar to the power semiconductor modules 300 in the inverter circuit unit 140 and the auxiliary converter 43 adopts a structure similar to the inverter circuit unit 142. Accordingly, a repeated explanation is not provided.

The switching power semiconductor elements in the embodiment are constituted with the upper arms IGBT 155 and the lower arms IGBT 157. The upper arms IGBT 155 and the lower arms IGBT 157 each include a collector electrode, an emitter electrode (a signal emitter electrode terminal) and a gate electrode (gate electrode terminal). The lower arm diode 156 is electrically connected between the collector electrode and the emitter electrode at each upper arm IGBT 155, the lower arm diode 158 is electrically connected between the collector terminal and the emitter electrode at each lower arm IGBT 157, as shown in the figure. The upper arm diode 156 and the lower arm diode 158 each include two electrodes, i.e., a cathode electrode and an anode electrode. The cathode electrodes are electrically connected to the collector electrodes of the upper arm IGBT 155 and the lower arm IGBT 157 and the anode electrodes are electrically connected to the emitter electrodes of the upper arm IGBT 155 and the lower arm IGBT 157, so as to define the direction running from the emitter electrodes toward the collector electrodes at the upper arm IGBT 155 and the lower arm IGBT 157 as the forward direction. MOSFETs (metal oxide semiconductor field effect transistors) may be used as the power semiconductor elements, instead. The alternative configuration achieved in conjunction with MOSFETs does not require the upper arm diodes 156 or the lower arm diodes 158.

Based upon information input thereto from a vehicle-side control device or a sensor (e.g., a current sensor 180), the control circuit 172 generates a timing signal used to control the timing with which the upper arm IGBTs 155 and the lower arm IGBTs 157 are switched. Based upon the timing signal output from the control circuit 172, the driver circuit 174 generates a drive signal used to engage the upper arm IGBTs 155 and the lower arm IGBTs 157 in switching operation.

The control circuit 172 is equipped with a microcomputer that determines, through arithmetic processing, the switching timing for the upper arm IGBTs 155 and the lower arm IGBTs 157. Information indicating a target torque value requested of the motor generator 192, the values of the electric currents provided from the upper/lower arm serial circuits to the stator coil of the motor generator 192 and the magnetic pole positions at the rotor of the motor generator 192 is input to the microcomputer. The target torque value is determined based upon a command signal output from a higher-order control device (not shown). The current values are each detected based upon a detection signal output from the current sensor 180. The magnetic pole positions are detected based upon a detection signal output from a rotating magnetic pole sensor (not shown) installed in the motor generator 192. While the embodiment is described in reference to the example in which three-phase current values are detected, the present invention may be adopted in a system in which two-phase current values are detected in correspondence to two phases.

The microcomputer in the control circuit 172 calculates a d-axis current command value and a q-axis current command value for the motor generator 192 based upon the target torque value and then calculates a d-axis voltage command value and a q-axis voltage command value based upon the differences between the d-axis current command value having been calculated and a detected d-axis current command value and between the q-axis current command value having been calculated and a detected q-axis current command value. The microcomputer then converts the d-axis voltage command value and the q-axis voltage command value thus calculated to a U-phase voltage command value, a V-phase voltage command value and a W-phase voltage command value based upon the detected magnetic pole positions. Subsequently, the microcomputer generates modulated pulse waves by comparing fundamental waves (sinusoidal waves) corresponding to the U-phase voltage command value, the V-phase voltage command value and the W-phase voltage command value with a carrier wave (triangular wave) and outputs the modulated waves thus generated to the driver circuit 174 where they are used as a PWM (pulse width modulation) signal.

In order to drive a lower arm, the driver circuit 174 amplifies the PWM signal and outputs the amplified PWM signal to the gate electrode of the corresponding lower arm IGBT 157 as a drive signal. In order to drive an upper arm, the driver circuit 174 first shifts the level of the reference potential of the PWM signal to an upper arm reference potential level, then amplifies the PWM signal and outputs the amplified PWM signal as a drive signal to the gate electrode of the corresponding upper arm IGBT 155. As a result, the upper arm IGBT 155 and the lower arm IGBT 157 are engaged in switching operation based upon the drive signals input thereto.

The control unit also detects abnormalities (such as overcurrent, overvoltage and excessively high temperature) so as to protect the upper/lower arm serial circuits. In order to enable the control unit to protect the upper/lower arm serial circuit, sensing information is input to the control circuits. For instance, current information pertaining to the electric currents flowing through the emitter electrodes of the upper arms IGBT 155 and the lower arms IGBT 157 is input from the signal emitter electrode terminals at the individual arms to the corresponding driver circuits collectively referred to as the driver circuit 174. As a result, the driver circuit 174 is able to detect any overcurrent and suspend the switching operation of the corresponding upper arm IGBT 155 or lower arm IGBT 157 upon detecting an overcurrent so as to protect the upper arm IGBT 155 or the lower arm IGBT 157 from the overcurrent. Temperature information pertaining to a temperature at each upper/lower arm serial circuit is input to the microcomputer from a temperature sensor (not shown) disposed in the upper/lower arm serial circuit. In addition, voltage information pertaining to the voltage on the DC positive electrode side in each upper/lower arm serial circuit is input to the microcomputer. Based upon the various types of information input thereto, the microcomputer executes detection for an excessively high temperature and an overvoltage, and suspends the switching operation of all the upper arms IGBT 155 and lower arms IGBT 157 upon detecting an excessively high temperature or an overvoltage so as to protect the upper/lower arm serial circuits from the high temperature or the overvoltage.

Electrical continuity and discontinuity of the upper arms IGBT 155 and the lower arms IGBT 157 in the inverter circuit unit 140 are switched in a predetermined order, and the electric current generated at the stator coil of the motor generator 192 during the switchover flows through the circuits that includes the diodes 156 and 158. It is to be noted that while the power conversion device 200 achieved in the embodiment includes a single upper/lower arm serial circuit disposed in the inverter circuit unit 140 in correspondence to each phase, the circuit that generates an AC corresponding to one of the three phases to be output to the motor generator may be configured with two upper/lower arm serial circuits connected in parallel as explained earlier.

A DC terminal 138 (see FIG. 1) located at each of the inverter circuit units 140 and 142 is connected to a laminated conductor plate 700 (see FIGS. 2 and 14) constituted with a positive conductor plate and a negative conductor plate. The laminated conductor plate 700 is a three-layer laminated wiring substrate with an insulating sheet (not shown) held between a positive pole-side conductor plate 702 and a negative pole-side conductor plate 704 each made up with a conductive plate assuming a large width along the direction in which the power modules are arrayed. The positive pole-side conductor plate 702 and the negative pole-side conductor plate 704 of the laminated conductor plate 700 are respectively connected to a positive conductor plate 507 and a negative conductor plate 505 included in a laminated wiring substrate 501 disposed in the capacitor module 500. The positive conductor plate 507 and the negative conductor plate 505 are also each constituted with a conductive plate assuming a large width along the direction in which the power modules are arrayed and together form a three-layer laminated wiring substrate holding an insulating sheet 517 (not shown) between them.

A plurality of capacitor cells 514 are connected in parallel at the capacitor module 500, with the positive side of the capacitor cells 514 connected to the positive conductor plate 507 and the negative side of the capacitor cells 514 connected to the negative conductor plate 505. The capacitor module 500 constitutes a smoothing circuit via which fluctuations in the DC voltage generated through the switching operation of the upper arm IGBT 155 and the lower arm IGBT 157 are minimized.

The laminated wiring substrate 501 of the capacitor module 500 is connected to a laminated input wiring substrate 230 connected to the DC connectors 138 at the power conversion device 200. The inverter device in the auxiliary converter 43, too, is connected to the laminated input wiring substrate 230. A noise filter is disposed between the laminated input wiring substrate 230 and the laminated wiring substrate 501. The noise filter, equipped with two capacitors connecting a ground terminal of a case 12 with the individual DC power lines, forms a Y-capacitor used to eliminate common mode noise.

The capacitor module 500 in the power conversion device configured as shown in FIG. 2 includes separate terminals (not assigned with reference numerals) so that DC power from the DC power source 136 is received via a terminal connected to a DC connector 138, which is different from a terminal, connected to the inverter terminal 140 or the inverter terminal 142. As a result, the extent to which noise generated at the inverter circuit 140 or the inverter circuit 142 adversely affects the DC source 136 is reduced. This, in turn, is bound to assure an enhanced smoothing effect.

In addition, since the capacitor module 500 is connected with individual power semiconductor modules 300 via laminated conductor plates, as described above, the inductance relative to the electric current flowing through the upper/lower arm serial circuit at each power semiconductor module 300 can be reduced, thereby making it possible to reduce the extent to which the voltage spikes whenever the current changes abruptly.

(Description of the Power Semiconductor Modules 300)

In reference to FIGS. 3 through 10, the structure adopted in the power semiconductor modules 300 in the inverter circuit unit 140 and the inverter circuit unit 142 is described in detail. FIG. 3(a) is a sectional view of a power semiconductor module 300 achieved in the embodiment, whereas FIG. 3(b) shows the power semiconductor module 300 achieved in the embodiment in a perspective.

Figure 4A:
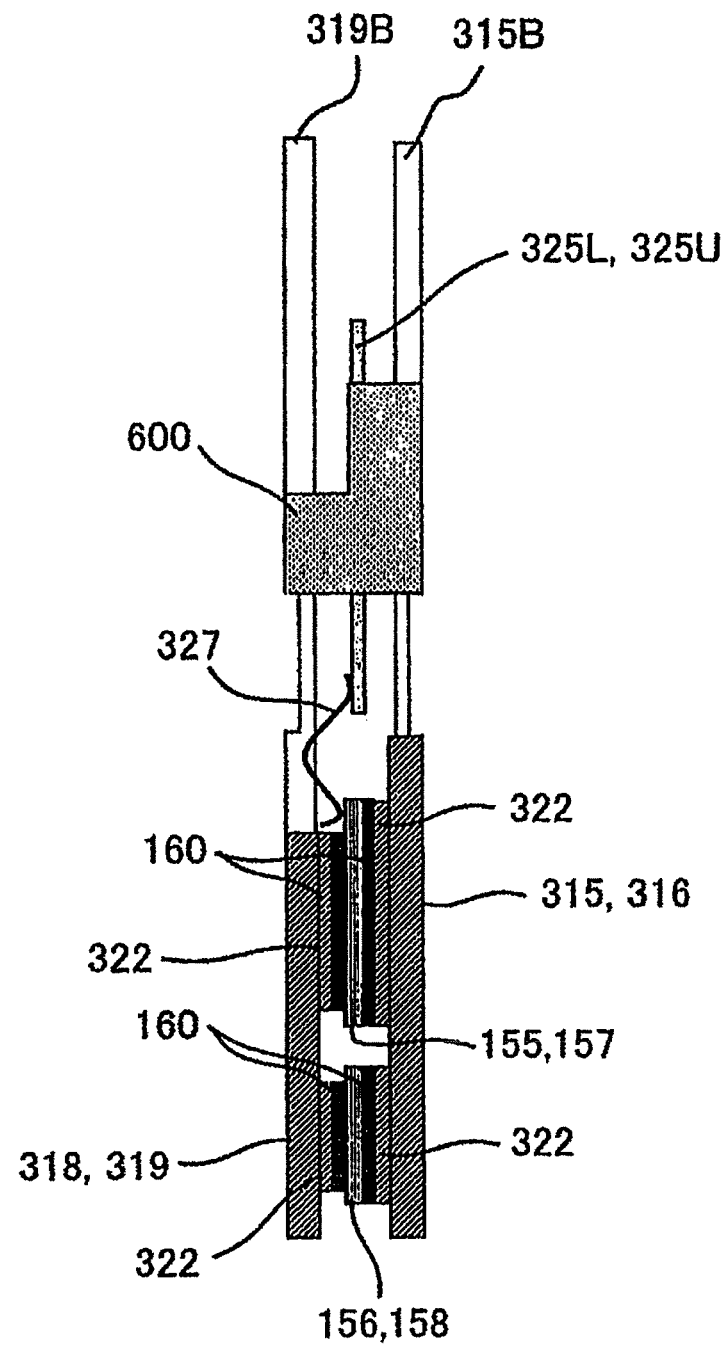
FIG. 4(a) shows the double-sided cooling-type power module in the semiconductor device achieved in the embodiment, minus a mold member.
Figure 4B:
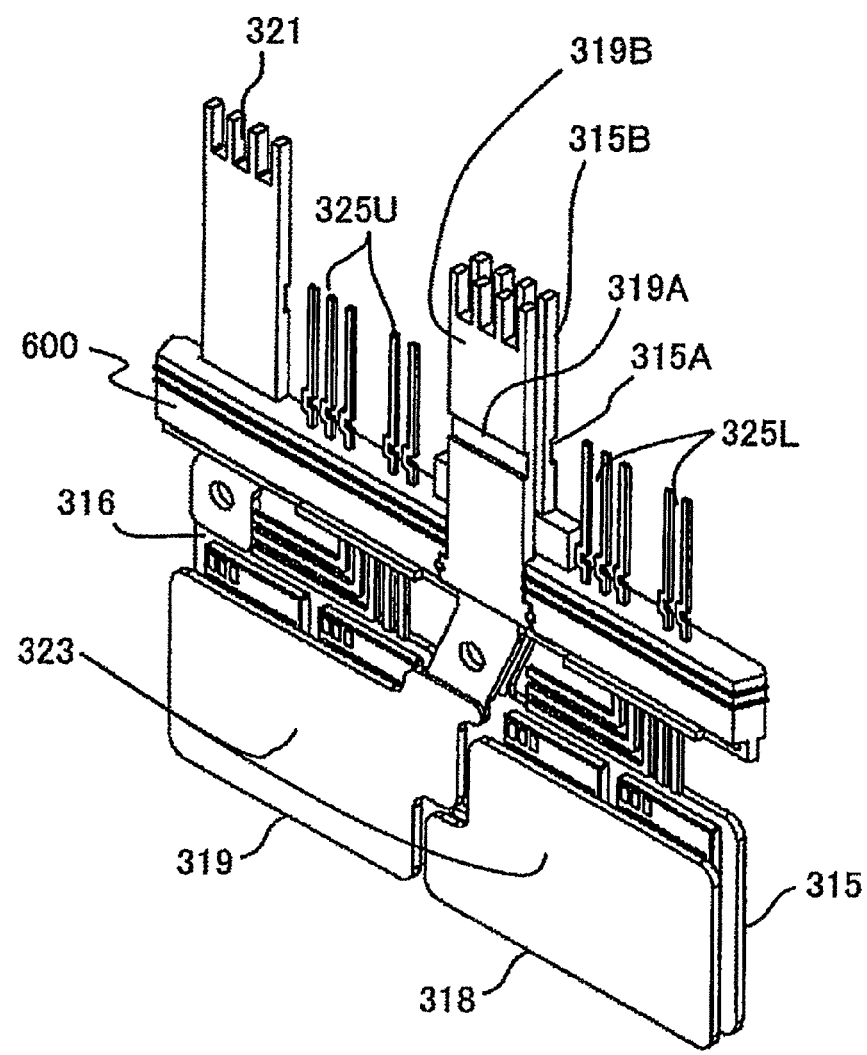
FIG. 4(b) is a perspective of the double-sided cooling-type power module in the semiconductor device achieved in the embodiment, minus the mold member.
Figure 4C:
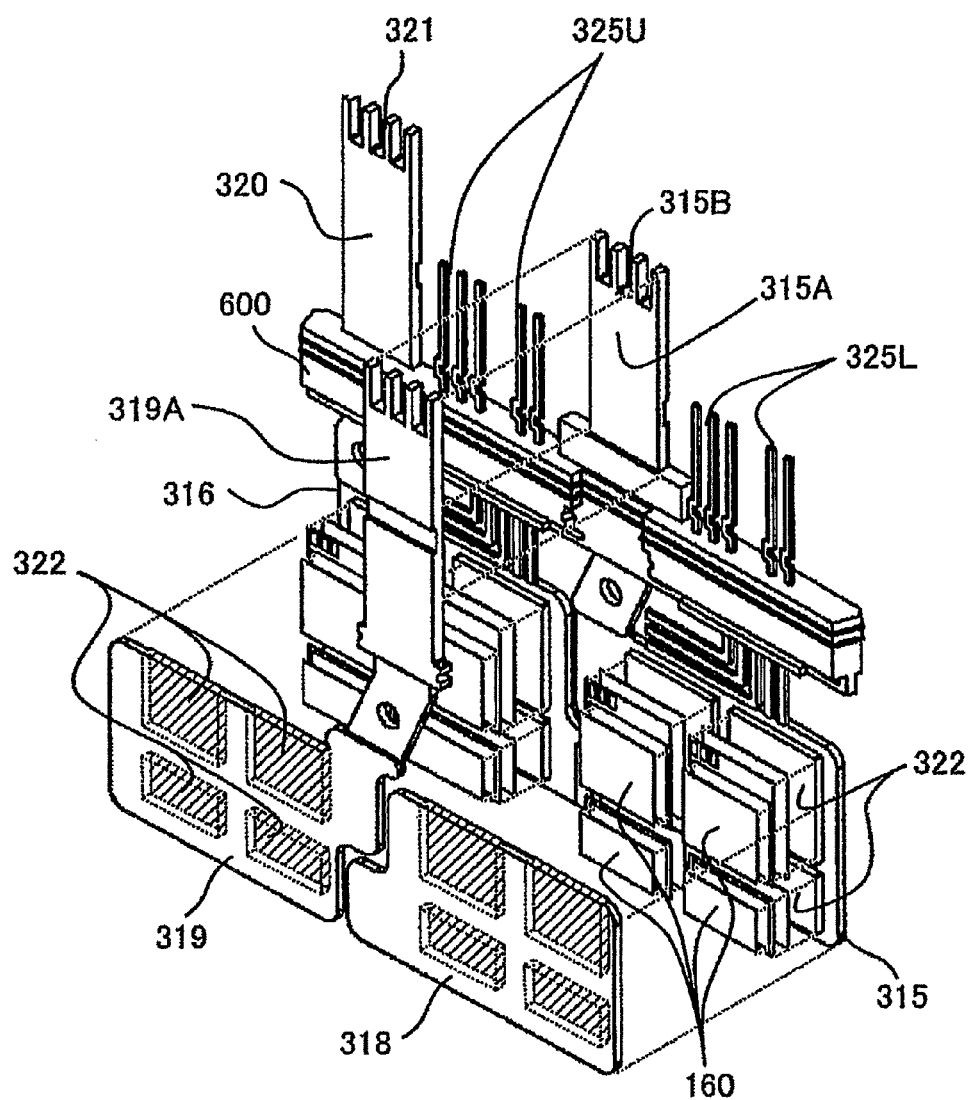
FIG. 4(c) is a perspective of the double-sided cooling-type power module in the semiconductor device achieved in the embodiment, minus the mold member, in a disassembled state.
Figure 5A:
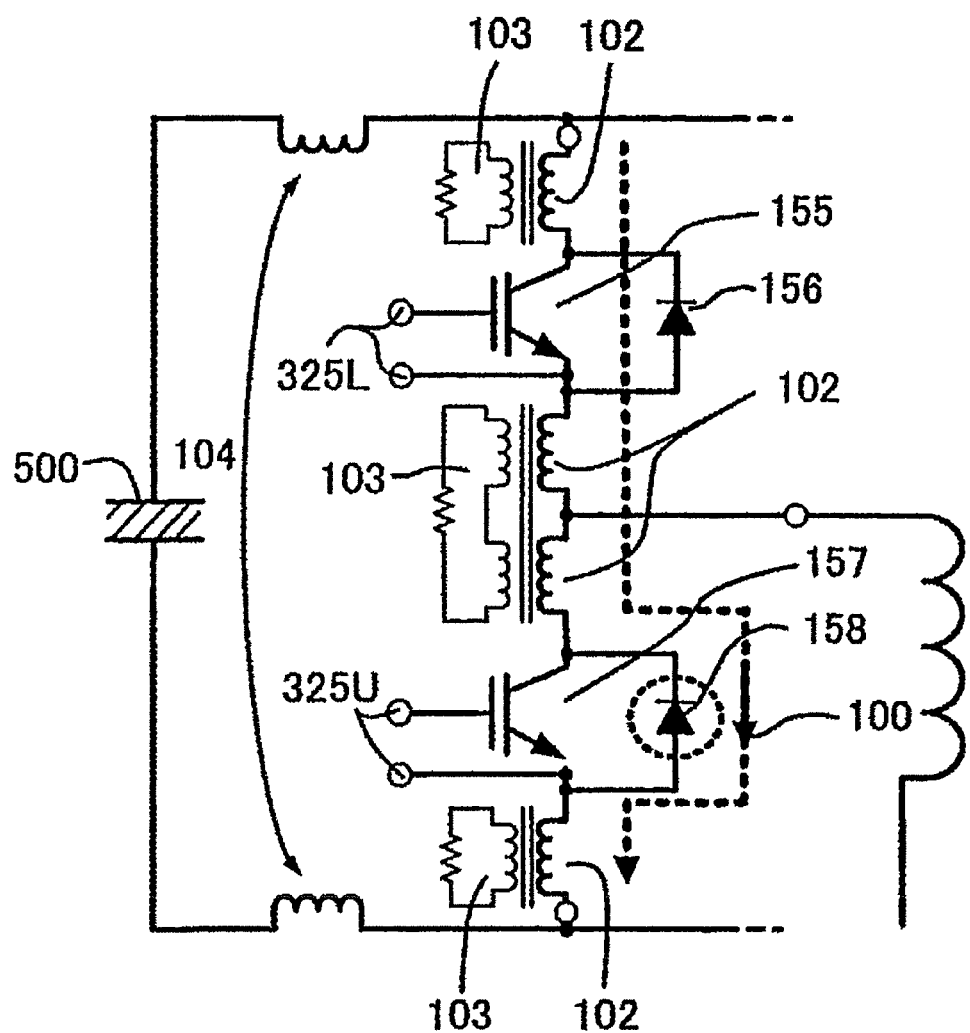
FIGS. 5(a) and 5(b) illustrate a current path of electric current flowing at the double-sided cooling-type power module in the semiconductor device achieved in the embodiment.
Figure 5B:
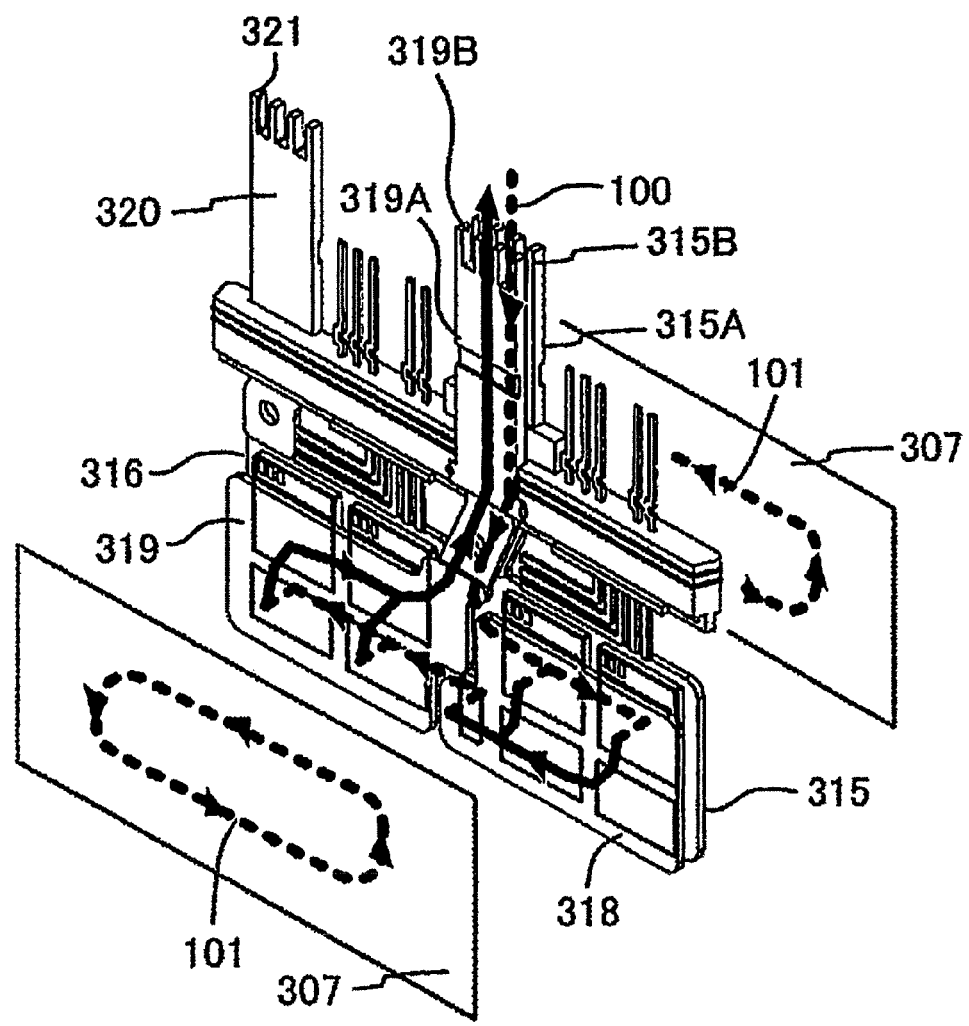

As shown in FIG. 4(b), FIG. 4(c) and FIG. 5(b), the power semiconductor elements constituting the upper/lower arm serial circuit are held in place between conductor plates 315 and 318 and between conductor plates 316 and 319. A supplementary mold member 600, formed with signal wiring integrated therein through integrated molding, is then attached to the conductor plates. The assembly is sealed with a first sealing resin 350 with the heat radiating surfaces of the conductor plates exposed, and insulating sheets 333 are then bonded to the assembly through thermal compression. The entire assembly is then inserted into the module case 304 and the insulating sheets 333 are attached through thermal compression bonding to the inner surface of the module case 304, which is a CAN-type cooler. A second sealing resin 351 is then poured in to fill any air pockets remaining inside the module case 304. In addition, a DC positive wiring 315A and a DC negative wiring 319A, constituting DC bus bars via which the power semiconductor elements are connected to the capacitor module 500, are disposed with DC positive terminals 315B and DC negative terminals 319B respectively formed at the front ends of the DC positive wiring 315A and the DC negative wiring 319A. An AC wiring 320 constituting an AC bus bar through which AC power is provided to the motor generator 192 or 194 is disposed with AC terminals 321 formed at the front end thereof. In the embodiment, the wirings 315A, 319A and 320, respectively disposed at the conductor plates 315, 319 and 316, are each formed as an integrated part of the corresponding conductor plate, and external signal terminals 325U and 325L, which connect with the drive circuit 174, are formed at the supplementary mold member 600 through insert molding.

The structure whereby the conductor plates supporting the elements are bonded to the inside of the module case 304 via the insulating sheets 333 as described above allows the power conversion device to be manufactured through the method to be described below in reference to drawings, and by adopting this manufacturing method, better productivity is assured. In addition, since heat generated at the power semiconductor elements can be transmitted to fins 305 with a high level of efficiency, the power semiconductor elements can be cooled more effectively. Furthermore, since thermal stress attributable to a change in the temperature or the like can be prevented, the power conversion device according to the present invention is bound to prove effective as an inverter installed in a vehicle where the temperature is likely to fluctuate significantly.

Figure 3A:
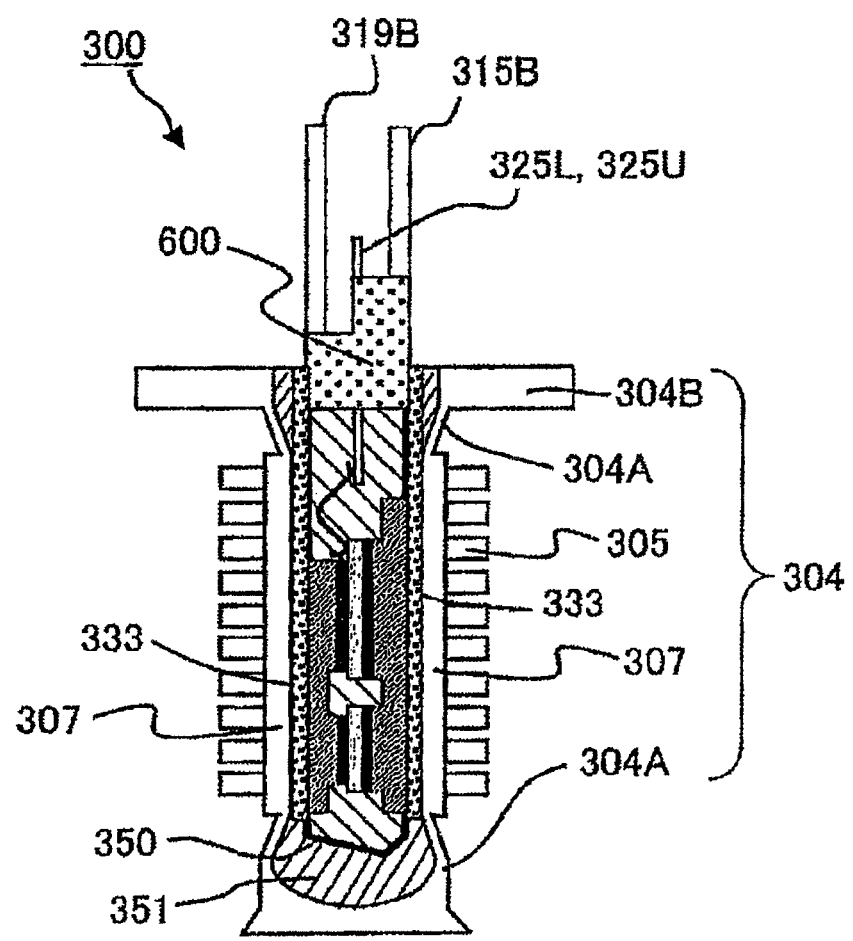
FIGS. 3(a) and 3(b) show a double-sided cooling-type power module in the semiconductor device achieved in the embodiment.
Figure 3B:
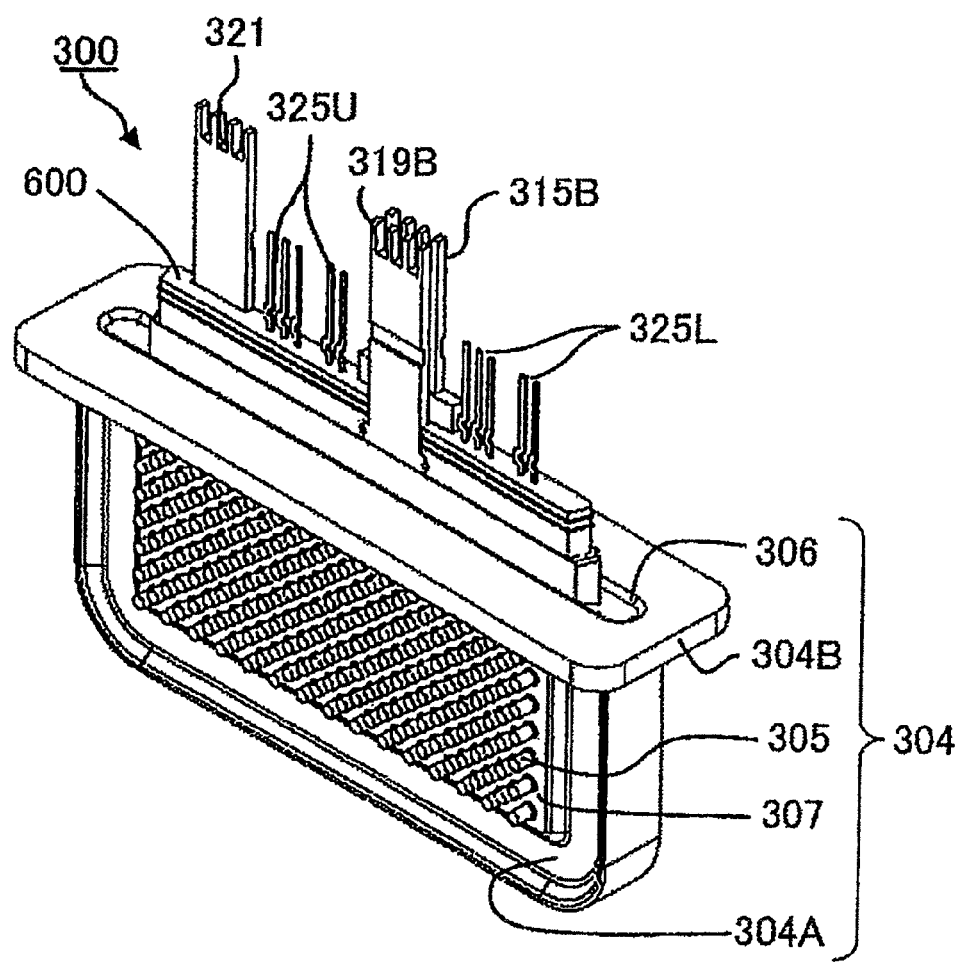

The module case 304, constituted of an aluminum alloy material such as Al, AlSi, AlSiC or Al—C, assumes a seamless CAN form achieved through integrated molding. The term "CAN form" is used to refer to a substantially rectangular parallelopiped shape with a solid bottom, having an insertion opening 306 formed at a specific surface thereof. The module case 304 does not have any opening other than the insertion opening 306, and the insertion opening 306 is enclosed by a flange 304B present along the outer edge thereof. In other words, the module case 304 is positioned with a first heat radiating surface and a second heat radiating surface, both ranging over a greater area compared to the other surfaces, facing opposite each other, three sides of the first heat radiating surface and three sides of the second heat radiating surface form sealed-in surfaces ranging over a smaller width compared to the two heat radiating surfaces facing opposite each other, and an opening is formed at the surface defined with the remaining one side of the first heat radiating surface and the remaining one side of the second heat radiating surface, as illustrated in FIGS. 3(a) and 3(b). The module case 304 does not need to be a perfect rectangular parallelopiped, and it may have rounded corners, as shown in FIG. 3. The module case 304, constituted of metal and assuming a shape such as that described above, assures a dependable seal for a cooling medium, such as water or oil, via the flange 304B even as the module case 304 is inserted in a flow passage through which the cooling medium flows. In other words, entry of the cooling medium through the inner space of the module case 304 and through the area where the terminals are present at the module case 304 is reliably prevented through a simple structure. In addition, at the outer wall of the module case 304, fins 305 are formed uniformly over the heat radiating bases 307 facing opposite each other, and a curved portion 304A with an extremely small thickness is formed at the periphery of each heat radiating surface. Since the curved portions 304A are formed to achieve a thickness small enough to allow the curved portions 304A to become deformed with ease as pressure is applied to the fins 305, the manufacturing steps following the insertion of a primary sealed module assembly 300A can be executed with better efficiency.

The heat generated at the power semiconductor module 300 as the power semiconductor elements are engaged in operation is diffused via the conductor plates on the two sides, transmitted to the insulating sheets 333 and discharged or dissipated into the cooling medium via the heat radiating bases 307 formed at the module case 304 and the fins 305 present at the heat radiating bases 307, thereby assuring a high level of cooling performance.

Figure 4D:
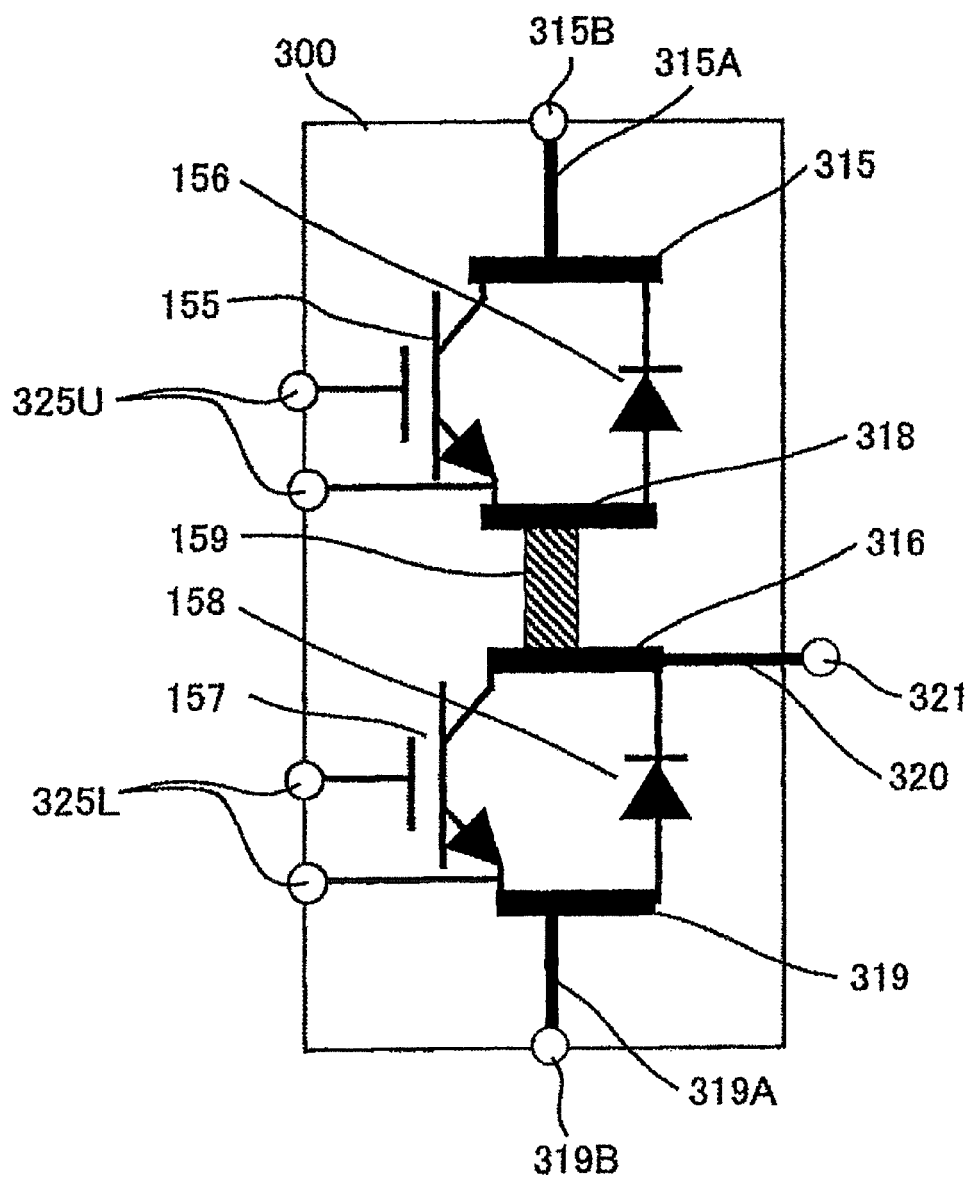
FIG. 4(d) is a circuit diagram pertaining to the double-sided cooling-type power module in the semiconductor device achieved in the embodiment.

The sectional view of the inside of a power semiconductor module 300 in FIG. 4(a) does not include an illustration of the module case 304, the insulating sheets 333, the first sealing resin 350 and the second sealing resin 351 so as to show the internal structure of the power semiconductor module 300 with better clarity. FIG. 4(b) shows the inside of the power semiconductor module 300 in a perspective, and FIG. 4(c) shows the power semiconductor module 300 in a disassembled state so as to better illustrate the structure shown in FIG. 4(a). FIG. 4(d) is a circuit diagram pertaining to the power semiconductor module 300. In addition, FIG. 5(a) is a circuit diagram illustrating how the inductance is reduced, whereas FIG. 5(b) shows current flow in a perspective, in reference to which the inductance reducing effect is to be explained.

The positional arrangement assumed for the power semiconductor elements and the conductor plates is first described in relation to the electrical circuit. The power semiconductor elements used in the embodiment include IGBTs and diodes. The DC positive conductor plate 315 and the first AC conductor plate 316 are disposed flush with each other substantially on a single plane, the collector electrode of the upper arm IGBT 155 and the cathode electrode of the upper arm diode 156 are firmly fixed to the DC positive conductor plate 315, and the collector electrode of the lower arm IGBT 157 and the cathode electrode of the lower arm diode 158 are firmly fixed to the first AC positive conductor plate 316. The second AC conductor plate 318 and the DC negative conductor plate 319 are disposed flush with each other substantially on a single plane. The emitter electrode of the upper arm IGBT 155 and the anode electrode of the upper arm diode 156 are firmly fixed to the second AC conductor plate 318. The emitter electrode of the lower arm IGBT 157 and the anode electrode of the lower arm diode 158 are firmly fixed to the DC negative conductor plate 319. The power semiconductor elements are each fixed to element-fixing portions located at the corresponding conductor plates. Each power semiconductor element assumes the shape of a flat plate with the various electrodes formed at the front and rear surfaces thereof. Thus, the DC positive conductor plate 315 and the second AC conductor plate 318 are set substantially parallel to each other and the first AC conductor plate 316 and the DC negative conductor plate 319 are disposed substantially parallel to each other with various IGBT and diodes, i.e., the power semiconductor elements held between them, thereby achieving a layered structure with the power semiconductor elements held between layers, as shown in FIG. 4(b). The first AC conductor plate 316 and the second AC conductor plate 318 are connected with each other via a middle electrode 159. Via the connection achieved by the middle electrode 159, the upper arm circuit and the lower arm circuit are electrically connected and, as a result, an upper/lower arm serial circuit is formed.

The electrodes are each fixed to the corresponding conductor plate by bonding the electrode to the conductor plates both electrically and thermally via a metal bonding material 337 (see FIG. 8(a)) constituted with solder, silver sheet or a cold sintered bonding material containing metal powder. The DC positive wiring 315A is formed as an integrated part of the DC positive conductor plate 315 with the DC positive terminals 315B formed at the front end of the DC positive wiring 315A. A basically identical structure is adopted in conjunction with the DC negative wiring 319A, which is formed as an integrated part of the DC negative conductor plate 319, with the DC negative terminal 319B formed at the front end of the DC negative wiring 319A.

The supplementary mold member 600 formed by using a resin material is disposed between the DC positive wiring 315A and the DC negative wiring 319A, which face opposite each other and range substantially parallel to each other along opposite directions relative to the power semiconductor positions. In addition, the external signal terminals 325L and 325U, formed as integrated parts of the supplementary mold member 600, extend toward the outside of the module as do the DC positive wiring 315A and the DC negative wiring 319A.

The resin material used to form the supplementary mold member 600 is ideally a thermosetting resin or a thermoplastic resin assuring reliable insulation. The signal wirings are formed at the supplementary mold member 600 through insert molding. The structure thus achieved assures reliable insulation between the DC positive wiring 315A and the DC negative wiring 319A and between the signal wirings and the individual wiring substrates. As a result, it becomes possible to lay out wirings at high density.

In addition, the DC positive wiring 315A and the DC negative wiring 319A are disposed so that they face opposite each other substantially parallel to each other. This positional arrangement allows a momentary electric current, which flows momentarily during a power semiconductor element switching operation, to flow through the DC positive wiring 315A and the DC negative wiring 319A, disposed so as to face opposite each other, along directions opposite from each other, thereby achieving an effect whereby the magnetic fields formed with the electric currents flowing along the opposite directions cancel each other out. With the magnetic fields thus canceled out, the inductance can be reduced. This inductance-reducing effect is described in detail in reference to FIG. 5(a). It is assumed that the lower arm diode 158 in FIG. 5(a) is currently in an electrically continuous state with a forward bias applied thereto. As the upper arm IGBT 155 is turned on in this state, a reverse bias is applied to the lower arm diode 158 and a recovery current, attributable to carrier displacement, flows through the upper and lower arms. At this time, a recovery current 100 flows as indicated in FIG. 5(b) through the various conductor plates 315, 316, 318 and 319. The recovery current 100 first flows through the DC positive terminal 315B, disposed parallel to the DC negative terminal 319B, as indicated by the dotted line, flows through the loop path formed with the conductor plates 315, 316, 318 and 319 and then flows again via the DC positive terminal 315B disposed parallel to the DC negative terminal 319B, as indicated by the solid line. As the current flows through the loop path, an eddy current 101 is induced at each heat radiating base 307. The magnetic field canceling effect achieved via the eddy currents 101 helps reduce a wiring inductance 102 in the loop path. It is to be noted that when the current path forms a more perfect loop shape, the inductance-reducing effect becomes more pronounced. In the embodiment, the recovery current, running through the loop current path, travels through an area closer to the terminal side at the conductor plates 315, as indicated by the dotted line, through the semiconductor elements, through an area further away from the terminal side at the conductor plate 318 as indicated by the solid line, then through an area further away from the terminal side at the conductor plate 316 as indicated by the dotted line, through the semiconductor elements again and finally through an area closer to the terminal side at the conductor plate 319, as indicated by the solid line. As the recovery current 100 flows through the path passing through areas closer to, and further away from the DC positive terminals 315B and the DC negative terminals 319B as described above, a loop circuit is formed. The recovery current 100 flowing through the loop circuit induces the eddy currents 101 at the heat radiating bases 307. The inductance is reduced as the magnetic fields attributable to the eddy currents 101 and the magnetic field attributable to the recovery current 100 cancel each other out.

(Description of the Supplementary Mold Member 600)

Figure 6A:
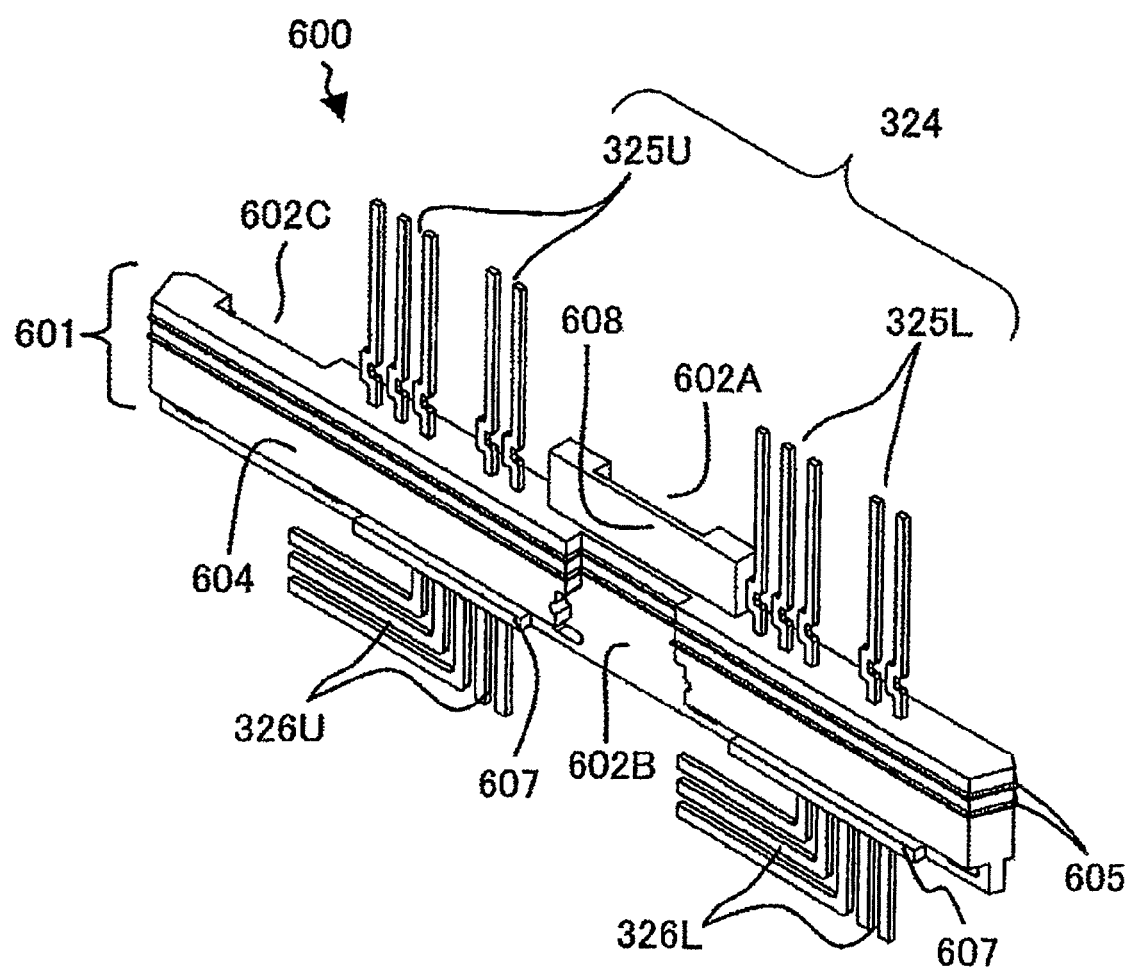
FIG. 6(a) illustrates a supplementary mold member in the double-sided cooling-type power module in the semiconductor device achieved in the embodiment.
Figure 6B:
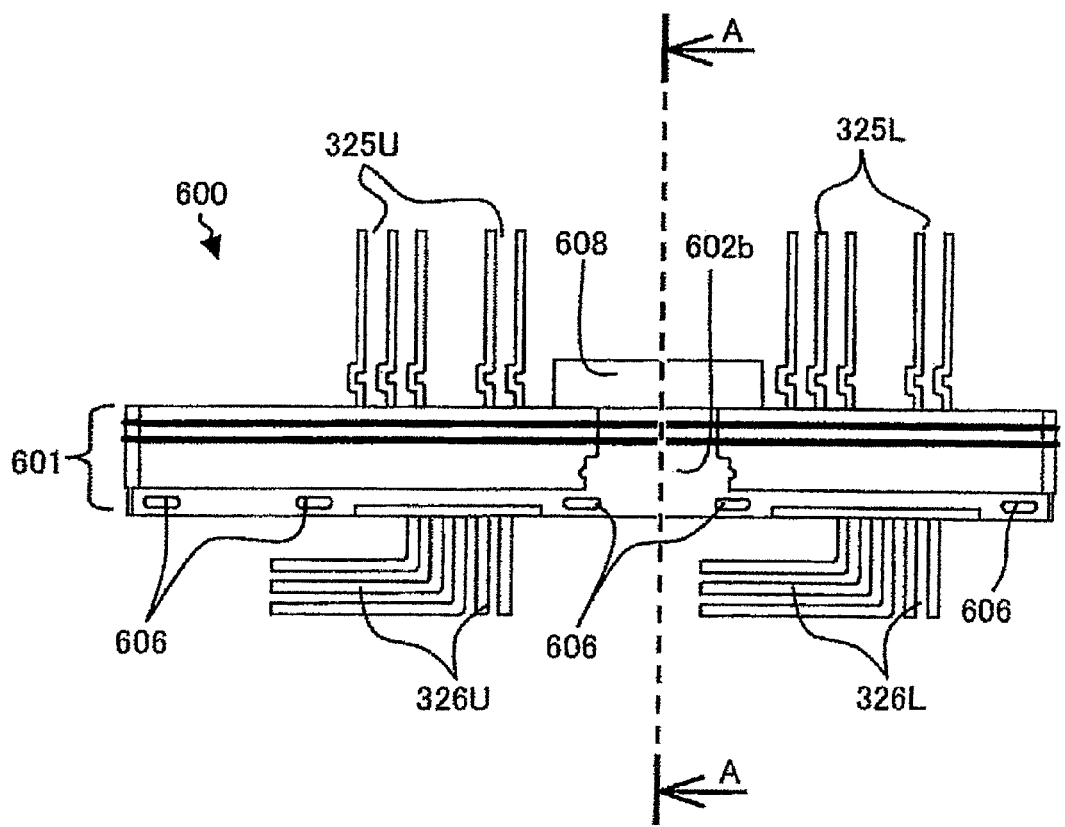
FIG. 6(b) is a side elevation of the supplementary mold member in the double-sided cooling-type power module in the semiconductor device achieved in the embodiment.
Figure 6C:
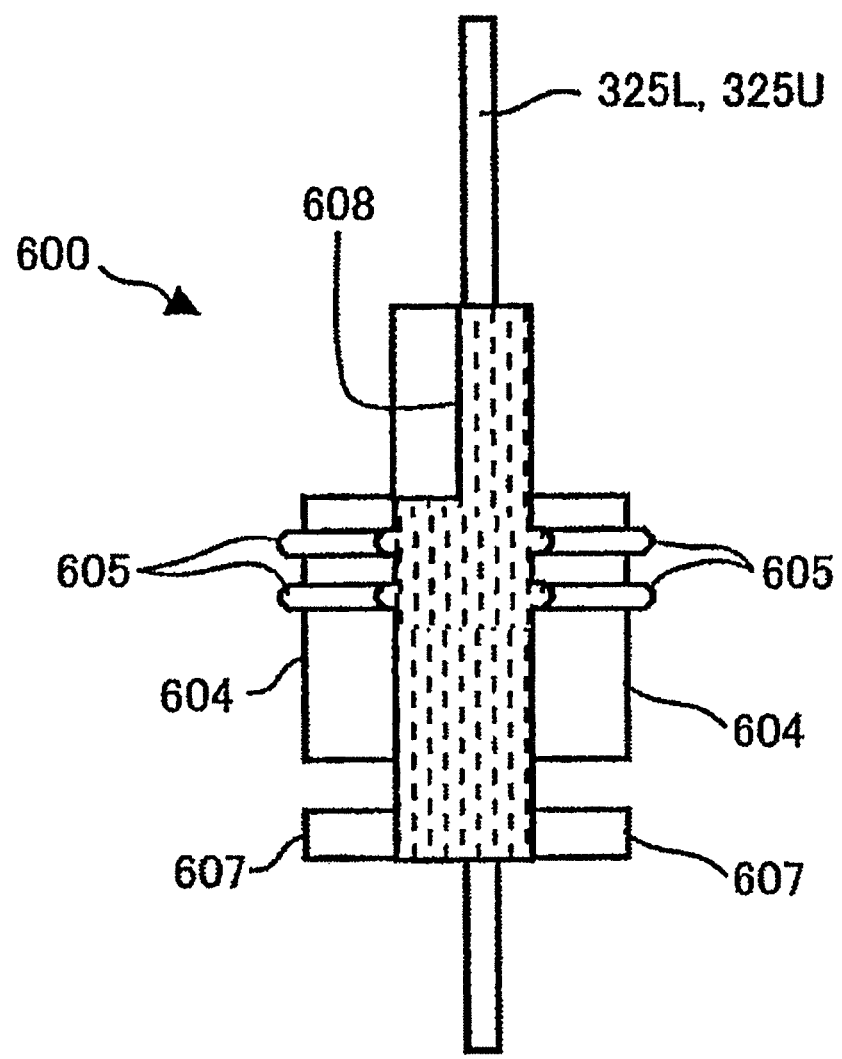
FIG. 6(c) is a sectional view of the supplementary mold member in the double-sided cooling-type power module in the semiconductor device achieved in the embodiment, taken through A-A in FIG. 6(b) showing the supplementary mold member in a side elevation.
Figure 6D:
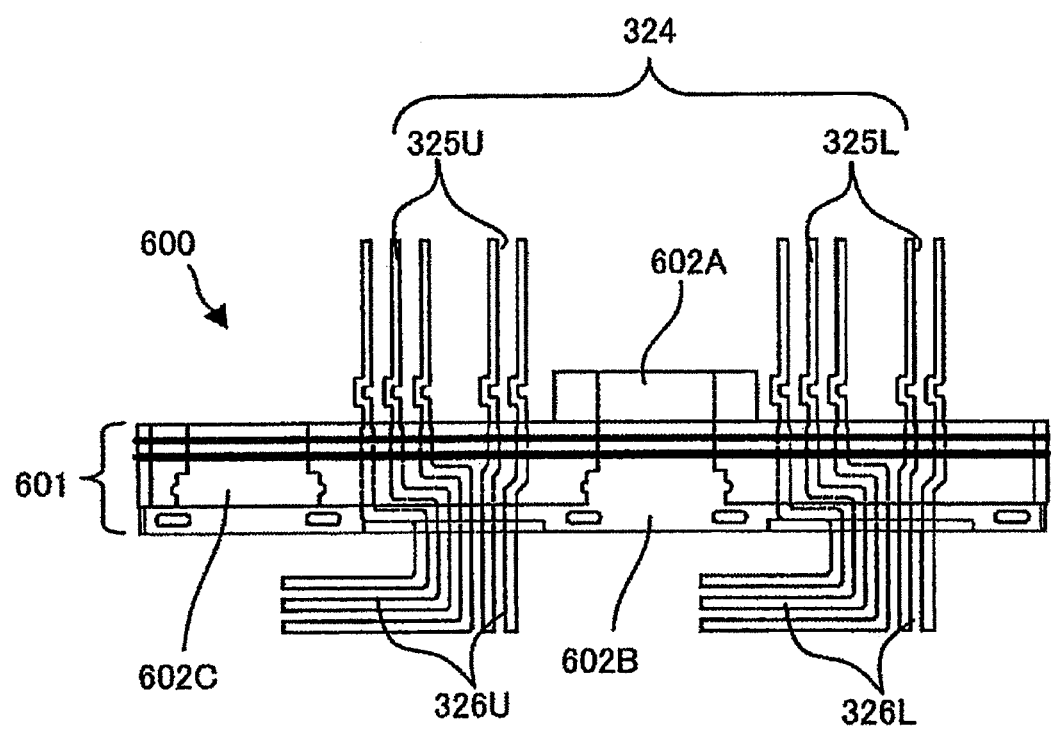
FIG. 6(d) is a phantom view of the supplementary mold member in FIG. 6(b) showing the supplementary mold member in the double-sided cooling-type power module in the semiconductor device achieved in the embodiment in a side elevation.
Figure 7:
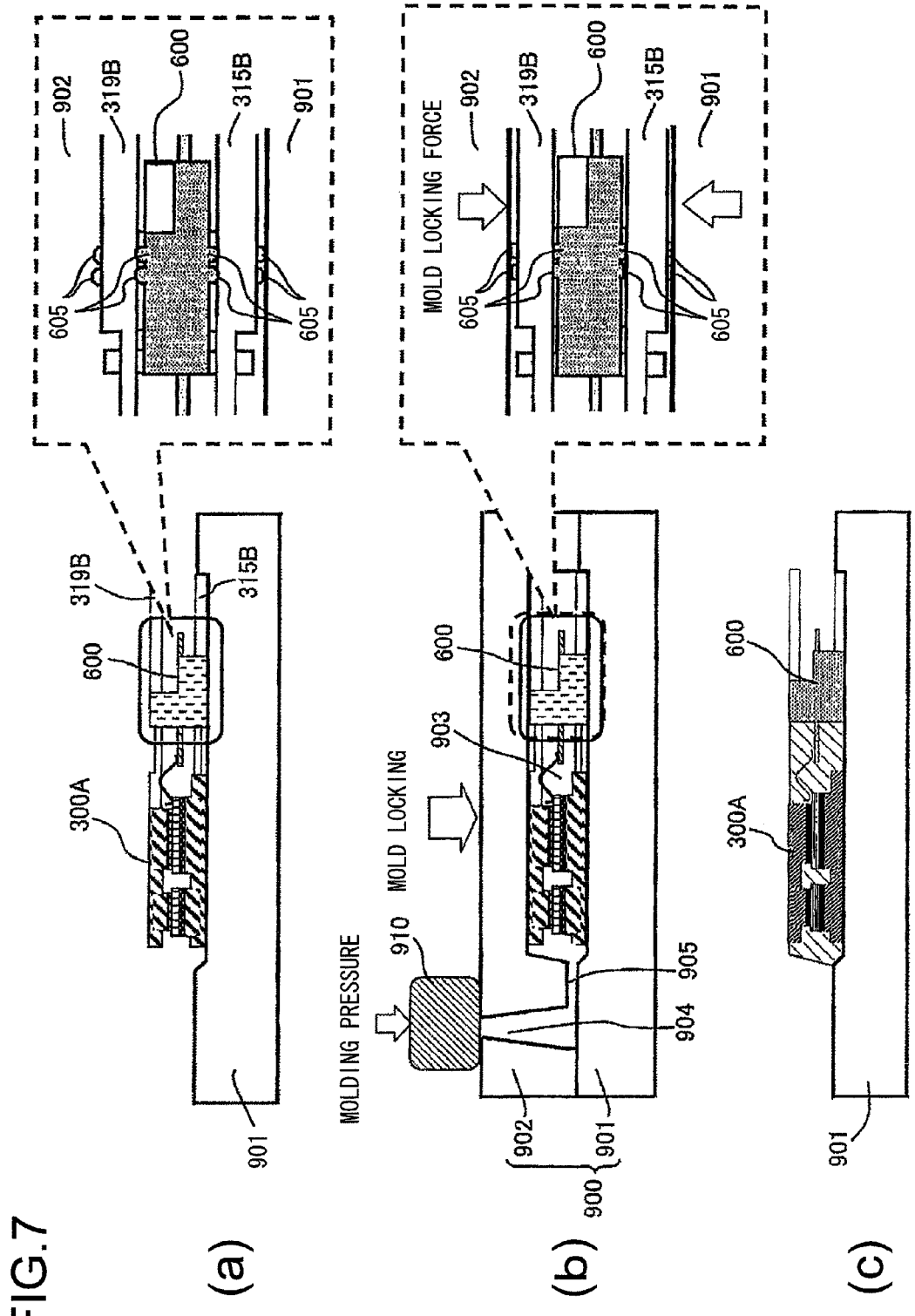
FIGS. 7(a) through 7(c) show a forming process through which the double-sided cooling-type power module in the semiconductor device achieved in the embodiment may be formed.
Figure 8:
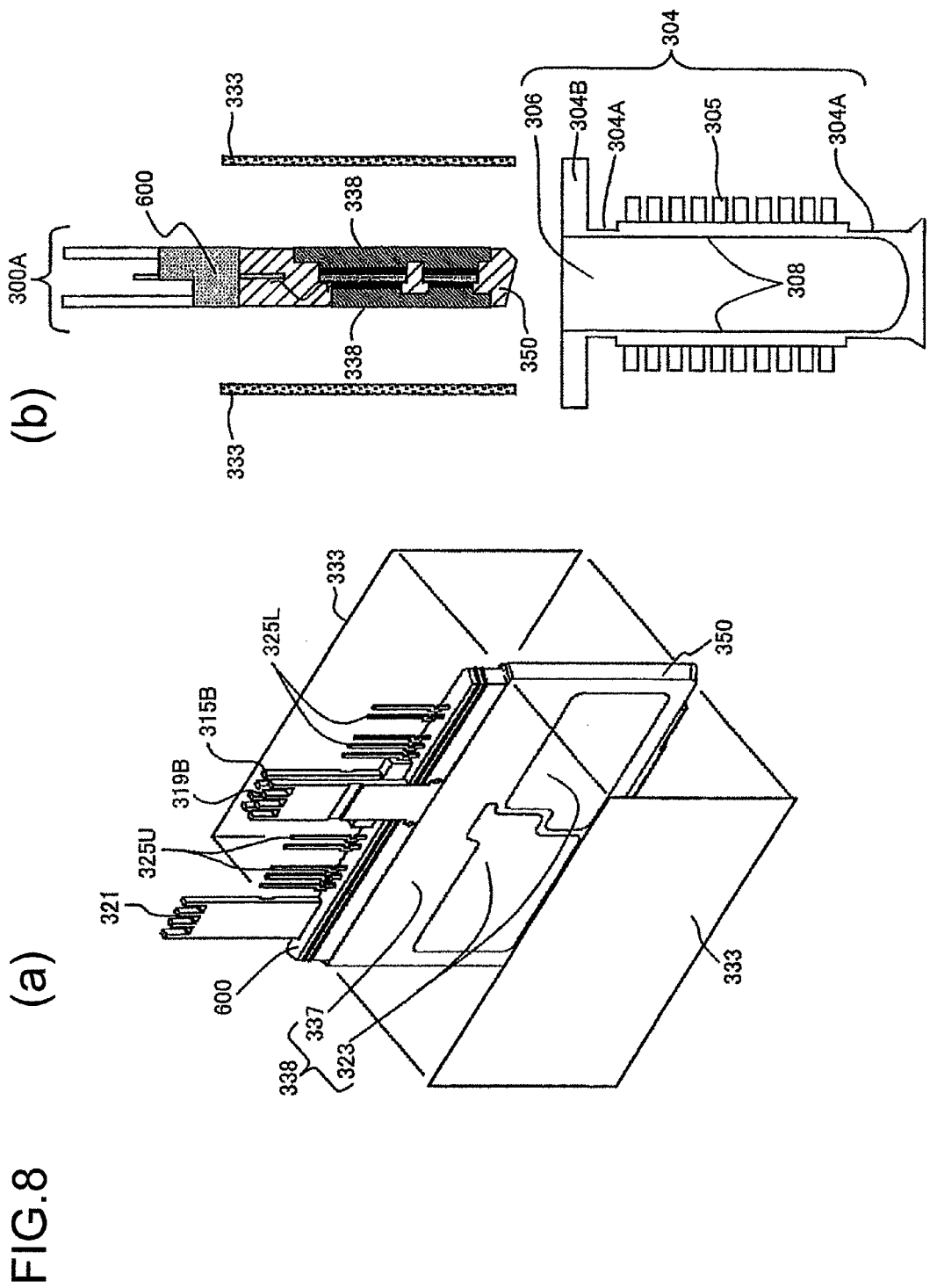
FIGS. 8(a) and 8(b) show the double-sided cooling-type power module in the semiconductor device achieved in the embodiment in a disassembled state.
Figure 9:
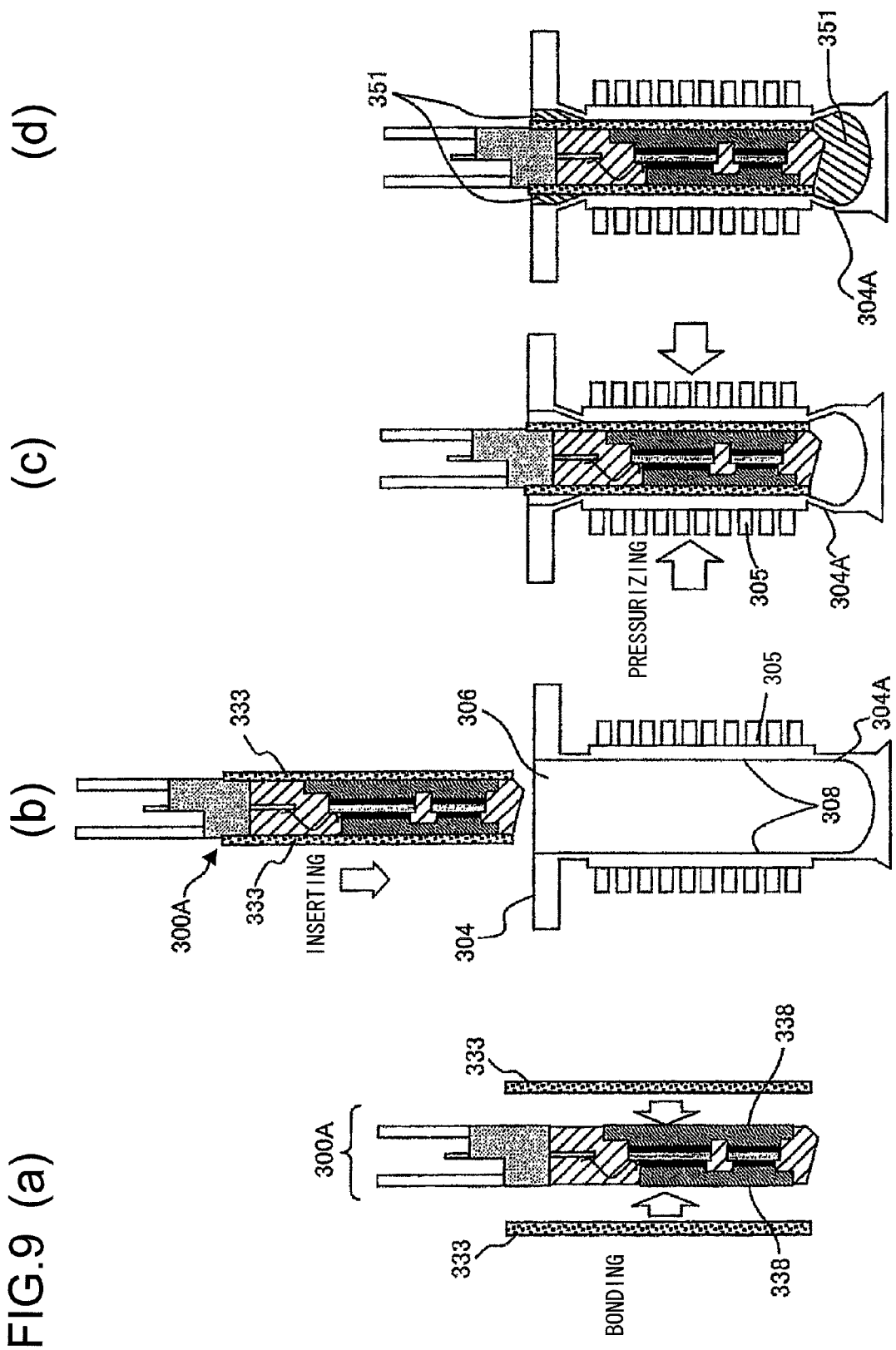
FIGS. 9(a) through 9(d) illustrate an assembly method through which the double-sided cooling-type power module in the semiconductor device achieved in the embodiment may be assembled.
Figure 10:
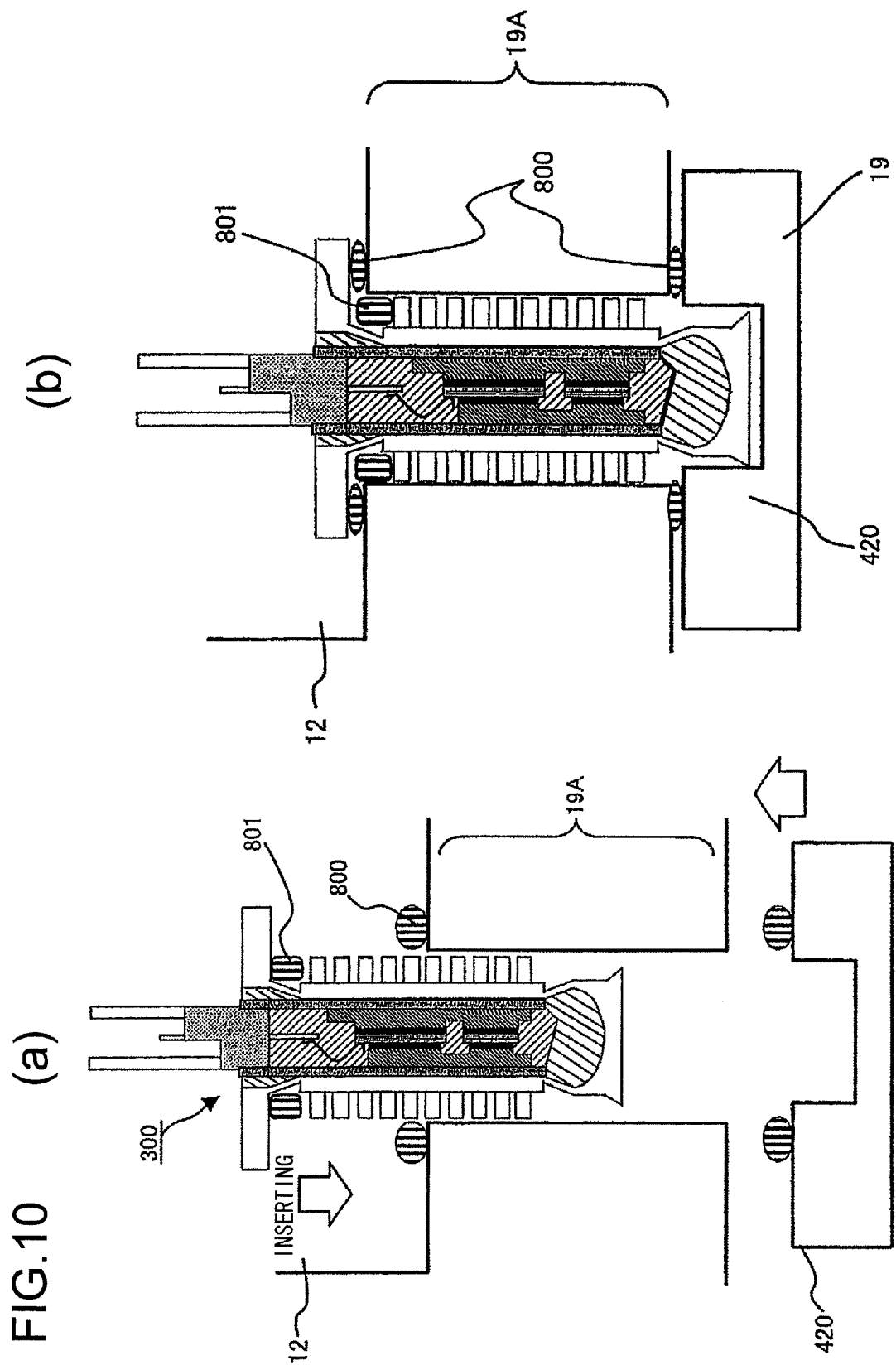
FIGS. 10(a) and 10(b) illustrate how the double-sided cooling-type power module in the semiconductor device achieved in the embodiment may be fitted with a water passage.

FIG. 6(a) shows the supplementary mold member 600 in a perspective, FIG. 6(b) shows the supplementary mold member 600 in a side elevation, FIG. 6(c) shows the supplementary mold member 600 in a sectional view taken through A-A in FIG. 6(b) and FIG. 6(d) is a phantom view of the supplementary mold member 600. FIGS. 7(a) through 7(c) illustrate in sectional views for clarity how a resin is injected with the supplementary mold member 600 set in a primary seal die for the power semiconductor module 300.

The structure of the supplementary mold member 600 is described in reference to the drawings listed above. A signal conductor 324 is formed as an integrated part of the supplementary mold member 600 through insert molding. The signal conductor 324, extending from one side of a sealing portion 601 of the supplementary mold member 600 toward the opposite side relative to the power semiconductor elements, forms the external signal terminals 325U and 325L via which connection with the driver circuit 174 that controls the power semiconductor elements and the like is achieved. On the opposite side of the signal conductor 324, signal terminals 326U and 326L, which are to connect, via, for instance, wires, with signal pads disposed at the surface electrodes of the power semiconductor elements, are formed. The sealing portion 601 extends so as to intersect the major axis determining the direction along which the DC positive wiring 315A, the DC negative wiring 319A or the AC wiring 320 extends, i.e., the sealing portion 601 extends along a direction substantially perpendicular to the major axis in the embodiment. As shown in FIGS. 4(b), 4(c) and 5(b), the supplementary mold member 600 ranges along the direction intersecting the axis running along the lengths of the wirings 315A, 319A and 320, as do the conductor plates 315, 316, 318 and 319. It ranges over a length greater than the sum of the lengths of the conductor plates 315 and 316 disposed side-by-side or the sum of the lengths of the conductor plates 318 and 319 disposed side-by-side. In other words, the range over which the supplementary mold member 600 extends along the lateral direction completely contains the conductor plates 315 and 316 set next to each other along the lateral direction or the conductor plates 318 and 319 set next to each other along the lateral direction.

In addition, as shown in FIG. 5(b) and FIGS. 6(a) and 6(b), indentations, at which bus bars constituted with the wirings 315A, 319A and 320 are to be fitted, are formed at wiring fitting portions 602A through 602C of the supplementary mold member 600 where the wirings 315A, 319A and 320 are to be bonded. The wirings are positioned as they are inserted at the corresponding indentations. This makes it possible to assemble the supplementary mold member with the wirings 315A, 319A and 320 fitted in accurate alignment, which, in turn, improves manufacturing productivity. Furthermore, the presence of a wiring insulating portion 608 between the DC positive wiring 315A and the DC negative wiring 319A assures reliable insulation and the wirings can be disposed so as to face opposite each other parallel to each other with a high degree of accuracy. The DC positive wiring 315A and the DC negative wiring 319A need to be disposed so as to face exactly opposite each other, since a misalignment is bound to compromise the magnetic field canceling effect and, consequently, compromising the inductance-reducing effect, as well. In addition, die compression surfaces 604 are formed at the sealing portion 601, with a plurality of resin leak-preventing projections 605 formed so as to encircle the supplementary mold member 600 by running the full length of the die compression surfaces 604 along the longer sides thereof. The wiring insulating portion 608 assumes the shape of a plate so as to assure a sufficient insulation distance between the DC positive wiring 315A and the DC negative wiring 319A.

In addition, it is desirable to seal the power semiconductor elements and the various power semiconductor elements and the various conductor plates in the power semiconductor module 300 with the first sealing resin 350, as shown in FIG. 3(a) and FIG. 8(b). In the sealing process, the supplementary mold member 600, with the wirings 315A, 319A and 320 and the signal wiring 324 supported thereat, is first inserted into a die 900 pre-heated to 150 to 180° C., as illustrated in FIG. 7(a). The conductor plates 315, 316, 318 and 319 in the embodiment are firmly connected to the corresponding wirings 315A, 319A and 320 and thus, as the supplementary mold member 600 is installed at a predetermined position, the primary circuits and the power semiconductor elements, too, are installed at predetermined positions. As a result, better productivity is assured and an improvement in reliability is achieved.

Next, as shown in FIG. 7(b), a first sealing resin base material 910 in a pressurized state is poured through a gate 904 so as to fill any space left unoccupied by the wirings 315A, 319A and 320, the power semiconductor elements and the conductor plates 315, 316, 318 and 319 with the first sealing resin base material 910 and also fill the space defined by a lower die 901, an upper die 902 and the supplementary mold member 600 with the first sealing resin base material 910. In other words, as the first sealing resin base material 910 is poured from a runner 905 into a cavity 903, the resin leak-preventing projections 605 at the supplementary mold member 600 come into tight contact with the upper and lower dies due to the locking force with which the lower die 901 and the upper die 902 are clamped together and the front ends of the resin leak-preventing projections 605 become crushed so as to come into even tighter contact with the die 900. In this state, the resin leak-preventing projections 605, together with the sealing portion 601, effectively prevent leakage of the first sealing resin base material 910 into the areas where the various terminals are located. The presence of the projections 605 projecting toward the die surfaces at the supplementary mold member 600 assures effective prevention of resin leakage, which, in turn, makes it possible to improve the manufacturing productivity. The detailed illustration in FIG. 6(c) provides a clear view of the projections 605. As shown in the figure, the wiring insulating portion 608 sustains the DC positive wiring 315A and the DC negative wiring 319A in an insulated state and holds the wirings 315A and 319A substantially parallel to each other. Thus, after the first sealing resin base material 910 is injected, the DC positive wiring 315A and the DC negative wiring 319A can be held in a desirable positional relationship to each other. Furthermore, since the projections 605 are also present between the wiring fitting portion 602A at the supplementary mold member 600 and the wiring 315A and between the wiring fitting portion 602B at the supplementary mold member 600 and the wiring 319A, leakage of the resin through the areas around the wirings 315A and 319A can be reliably prevented as well.

Since the supplementary mold member 600 is placed inside the die 900 preheated to approximately 150 to 180° C., it is desirable to form the sealing portion 601 with a thermoplastic resin liquid crystal polymer, polybutylene terephthalate (PBT) or a polyphenylene sulfide resin (PPS) assuring a high level of heat resistance. It is to be noted that the first sealing resin 350 and the second sealing resin 351 are each constituted of a material different from that used to form the supplementary mold member 600.

A plurality of through holes 606 are formed one after another along the lengthwise direction, in which the longer sides of the supplementary mold member 600 extend, as illustrated in FIG. 6(b) so as to open on two sides of the supplementary mold member 600 facing opposite each other along the crosswise direction, i.e., on the sides toward the power semiconductor chips. Once the supplementary mold member 600 is sealed with the first sealing resin 350 having flowed into the through holes 606 and having hardened inside the through holes 606, an anchor effect, whereby the supplementary mold member 600 is firmly held with the first sealing resin 350 and will not become separated from the first sealing resin 350 even under stress induced by a temperature change or a mechanical vibration, manifests. Solid adherence of the supplementary mold member 600 to the first sealing resin 350 can be assured by forming projections and indentations instead of through holes. Furthermore, a certain level of adherence can be assured with a polyimide coating applied to the supplementary mold member 600 or by roughening the surfaces of the supplementary mold member 600.

(Assembling the Power Semiconductor Module 300)

FIG. 8(a) is a perspective of a primary sealed module assembly 300A achieved by sealing the upper/lower arm serial circuit, constituted with the plurality of power semiconductor elements and the conductor plates, as shown in FIG. 4(b), with the first sealing resin 350 through primary sealing. FIG. 8(b) shows the power semiconductor module 300 in a disassembled state in a sectional view. The primary sealed module assembly 300A can be manufactured through the method illustrated in FIGS. 7(a) through 7(c). The conductor plates in the primary sealed module assembly 300A each include a heat transfer surface 323 (see FIG. 4(b)) located on the side opposite from the side where an element fixing portion 322 (see FIGS. 4(a) and 4(c)), to which a power semiconductor element is fixed, is present. The element fixing portions 322 are exposed at the surfaces of the primary sealed module assembly 300A having been sealed with the first sealing resin 350, as shown in FIG. 8(a). The conductor plates form insulating sheet bonding surfaces 338 together with first sealing resin surfaces 337 (see FIG. 8(a)). The insulating sheet bonding surfaces 338 are each formed on one of the two sides of the primary sealed module assembly 300A. As a result, the flow of the heat generated at the power semiconductor elements reaches the insulating sheets 333 through diffusion without being blocked by the first sealing resin 350, making it possible to reduce the heat resistance over the areas ranging from the power semiconductor elements through the insulating sheets 333.

FIGS. 9(a) through 9(d) illustrates the thermo-compression bonding process through which the primary sealed module assembly 300A with the insulating sheets 333 attached thereto is bonded to the module case 304.

While the insulating sheet bonding surfaces 338 are still in a semi-hardened state, the insulating sheets 333 are tacked onto the insulating sheet bonding surfaces 338 in a vacuum and are held in tight contact with the insulating sheet bonding surfaces 338 so as to achieve a condition without voids, as shown in FIG. 9(a).

Next, the primary sealed module assembly 300A is inserted through the insertion opening 306 into the module case 304 so as to set the insulating sheets 333 to face opposite flat inner surfaces 308 having undergone an anodic oxide coating process, as shown in FIG. 9(b).

Then, the module case 304 is pressurized from the sides where the fins 305 are formed toward the primary sealed module assembly 300A inserted in the module case 304 at high temperature in a vacuum, as shown in FIG. 9(c). This pressurizing force causes a slight deformation of the curved portions 304A to allow the insulating sheets 333 to come into contact with the flat inner surfaces 308 having undergone a surface treatment to assure reliable bonding. Since the module case 304 is subjected to high-temperature, vacuum conditions as explained earlier, a bonding force occurs at the contact interfaces where the insulating sheets 333 contact the flat inner surfaces 308. It is to be noted that the module case 304 in the embodiment is a CAN-type cooler, as has been described earlier.

Next, the remaining space inside the module case 304, not occupied by the primary sealed module assembly 300A and the insulating sheets 333, is filled with the second sealing resin 351, as shown in FIG. 9(d). The second sealing resin 351 is poured through gaps formed between the ends of the supplementary mold member 600 facing opposite each other along the lengthwise direction and the ends of the opening at the module case 304 facing opposite each other along the lateral direction, as shown in FIG. 3(b). As a result, the space on the two sides of the housing chamber in the module case 304, ranging to the sides of the supplementary mold member 600, the sides of the opening of the module case 304 and the opening of the module case 304, and the space at the bottom of the module case 304 become filled with the second sealing resin 351.

(Attaching the Power Semiconductor Module 300 to the Water Passage)

FIGS. 10(a) and 10(b) illustrates a process through which the power semiconductor module 300 is mounted at the case 12 (see FIG. 13) of the power conversion device. The case 12 includes a cooling jacket 19A functioning as a cooling unit where a flow passage 19 through which the cooling medium flows, is formed. An opening is formed at the top side of the cooling jacket 19A and an opening is also formed on the side facing opposite the upper opening. The power semiconductor module 300 is inserted through the upper opening, and coolant leakage is prevented by seals 800 and 801 and the flange 304B of the module case 304. The coolant, which may be, for instance, water, flows along the axial direction in which the upper arm circuit and the lower arm circuit are disposed next to each other, i.e., along a direction intersecting the direction in which the power semiconductor module 300 is inserted.

In the structure described above, the upper arm circuit held between the conductor plates 315 and 318, and the lower arm circuit held between the conductor plates 316 and 319, are disposed side-by-side along the direction in which the coolant flows. This configuration allows the module to be provided as a more compact unit. In addition, since a lower profile is achieved, the fluid resistance against the coolant flowing through the passage can be minimized.

The upper arm circuit and the lower arm circuit are each formed with two power semiconductor elements connected in parallel, as has been described in reference to FIG. 5(b). The two power semiconductor elements connected in parallel, held between the semiconductor plates 315 and 318 or between the conductor plates 316 and 319, are disposed next to each other along the direction of the coolant flow. This structure allows the entire module to be provided as a more compact unit.

In the power semiconductor module 300 achieved as described above in the embodiment by housing the primary sealed module assembly 300A with the built-in upper arm circuit and lower arm circuit and the resin insulating layers 333 inside a fully closed seamless module case 304, the cooling medium is not allowed to seep through to the built-in upper arm circuit and lower arm circuit and the resin insulating layers 333.

In addition, the structure achieved in the embodiment, which allows heat generated as the power semiconductor elements are engaged in operation to be diffused via the conductor plates from the two sides, to the insulating sheets 333 and then to be discharged through the heat radiating bases 307 and the fins 305 at the module case 304, assures a high level of the cooling performance, good reliability and high current density.

The supplementary mold member 600, constituted of an insulating resin material disposed between the DC positive wiring 315A and the DC negative wiring 319A, holds them together. The presence of the supplementary mold member 600 allows the DC positive wiring 315A and the DC negative wiring 319A to be disposed so as to face opposite each other substantially parallel to each other with a high level of reliability while assuring electrical isolation. As a result, a lower inductance can be achieved while assuring solid insulation and good reliability, which, in turn, enables the power conversion device to engage in a high-speed switching operation in a stable manner to lead to greater control freedom and a more desirable current balance. Consequently, since a number of power semiconductor modules 300 can be connected in parallel, the current capacity of the power conversion device can be increased with ease.

Furthermore, the resin leakage preventing projections 605 and the through holes 606 formed at the supplementary mold member 600 effectively prevent resin leakage during the sealing process so as to improve manufacturing productivity while assuring structural reliability with the first sealing resin 350 firmly holding the supplementary mold member 600 in place.

Second Embodiment

Figure 11:
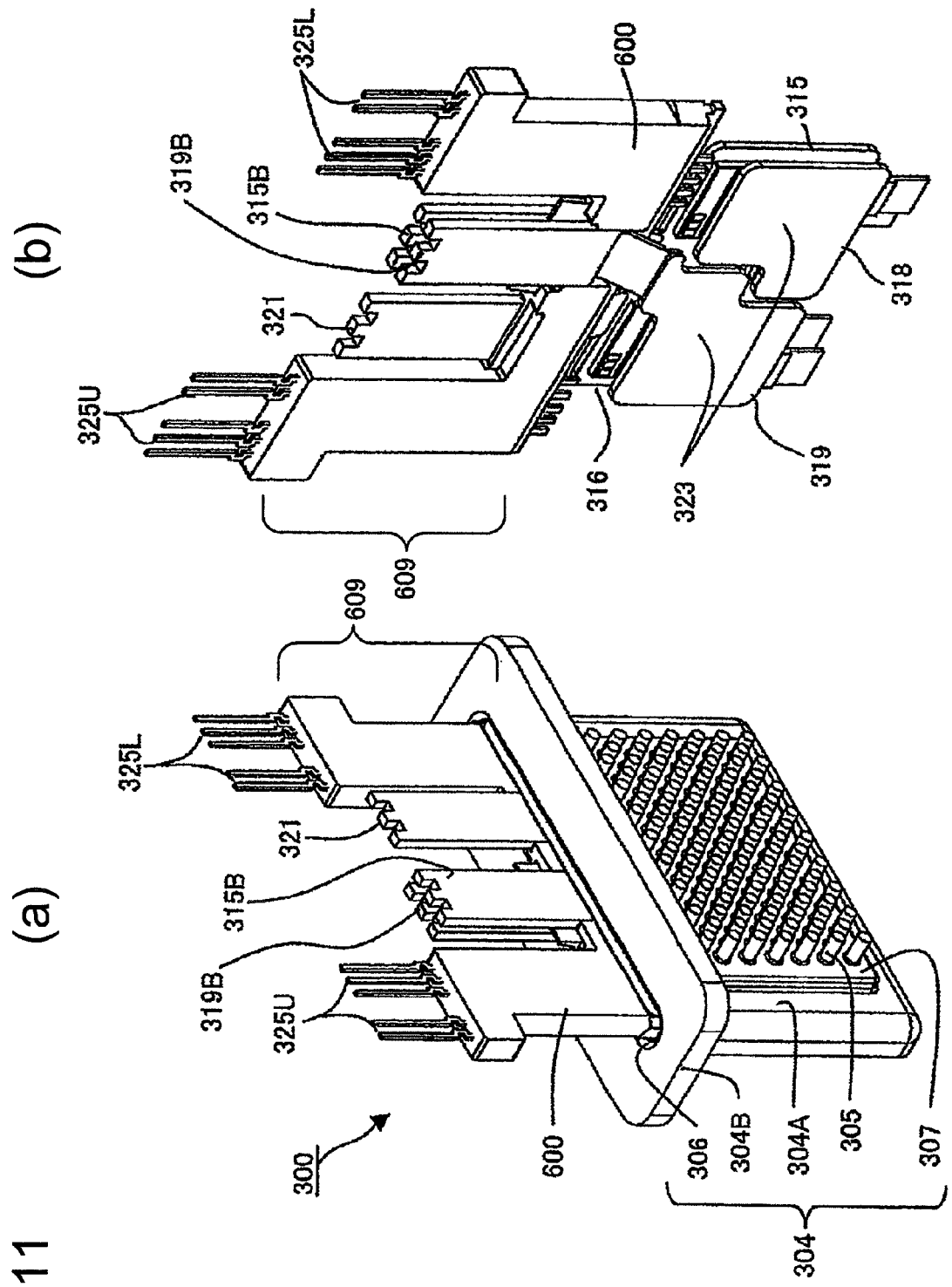
FIGS. 11(a) and 11(b) present another example of a double-sided cooling-type power module that may be included in the semiconductor device achieved in the embodiment.

FIG. 11(*a*) shows a power semiconductor module 300 achieved in the second embodiment in a perspective, whereas FIG. 11(*b*) is a perspective showing the inside of the power semiconductor module 300 minus the module case 304, the insulating sheets 333, the first sealing resin 350 and the second sealing resin 351. While the following explanation focuses on the features differentiating the second embodiment from the first embodiment, structural elements assigned with the same reference numerals as those in the first embodiment fulfill similar functions. A single power semiconductor element is installed in correspondence to each of the two (upper and lower) arms in the embodiment. Since this reduces the area taken up by an element-fixing portion at each conductor plate, the power semiconductor module 300 assumes a smaller dimension along the lengthwise direction compared to the corresponding length of the power semiconductor module in the first embodiment, which is indicated in FIG. 3(*b*). Advantages similar to those of the first embodiment can be achieved by reducing the corresponding dimension of the supplementary mold member 600 as well.

In addition, the supplementary mold member 600 in the embodiments includes wiring with wiring extension portions 609 formed thereat so as to elongate the signal wiring plate 324 while assuring reliable insulation. Namely, the signal wiring plate 324 is protected so that a switching control signal can be transmitted dependably even as the signal wiring plate 324 connected with the driver circuit 174 through the area where high-power wirings are present, is exposed to a high voltage. As a result, a high level of electrical reliability is assured for the power semiconductor module 300 with various terminals projecting out together from the side where the flange 304B is present.

Figure 13:
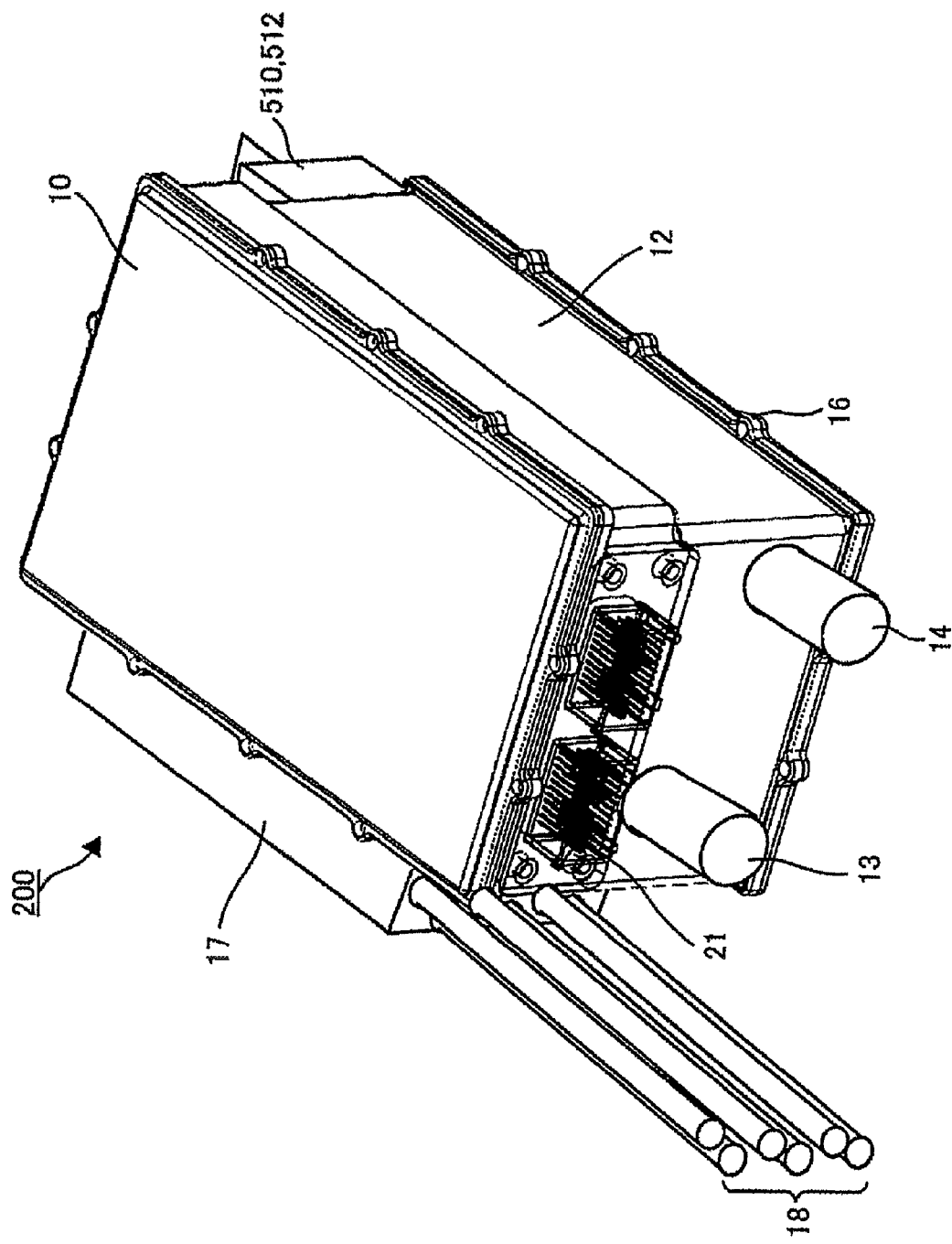
FIG. 13 shows the overall structure of the semiconductor device achieved in the embodiment.
Figure 14:
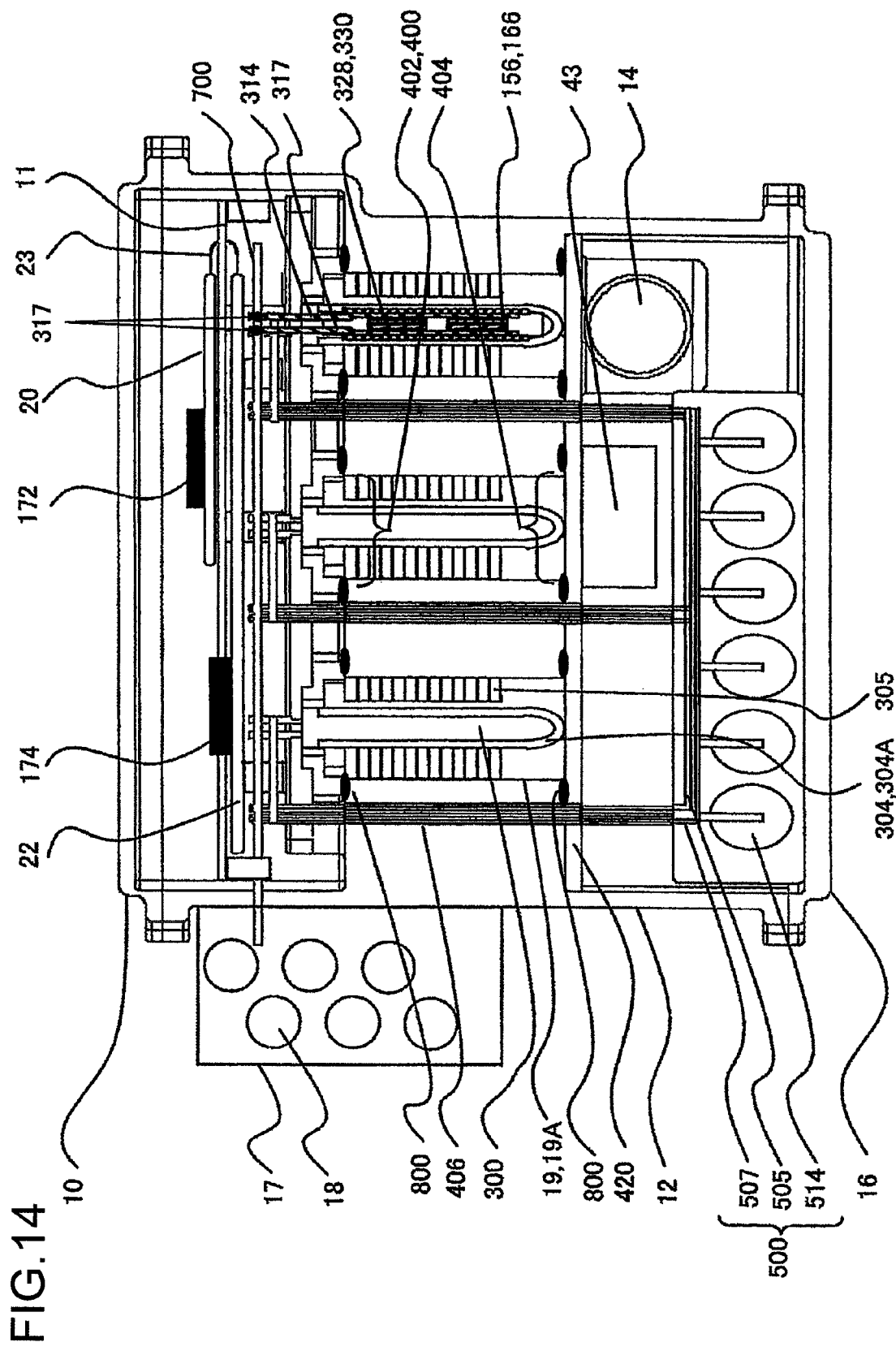
FIG. 14 shows, in a sectional view, the overall structure of the semiconductor device achieved in the embodiment.
Figure 15:
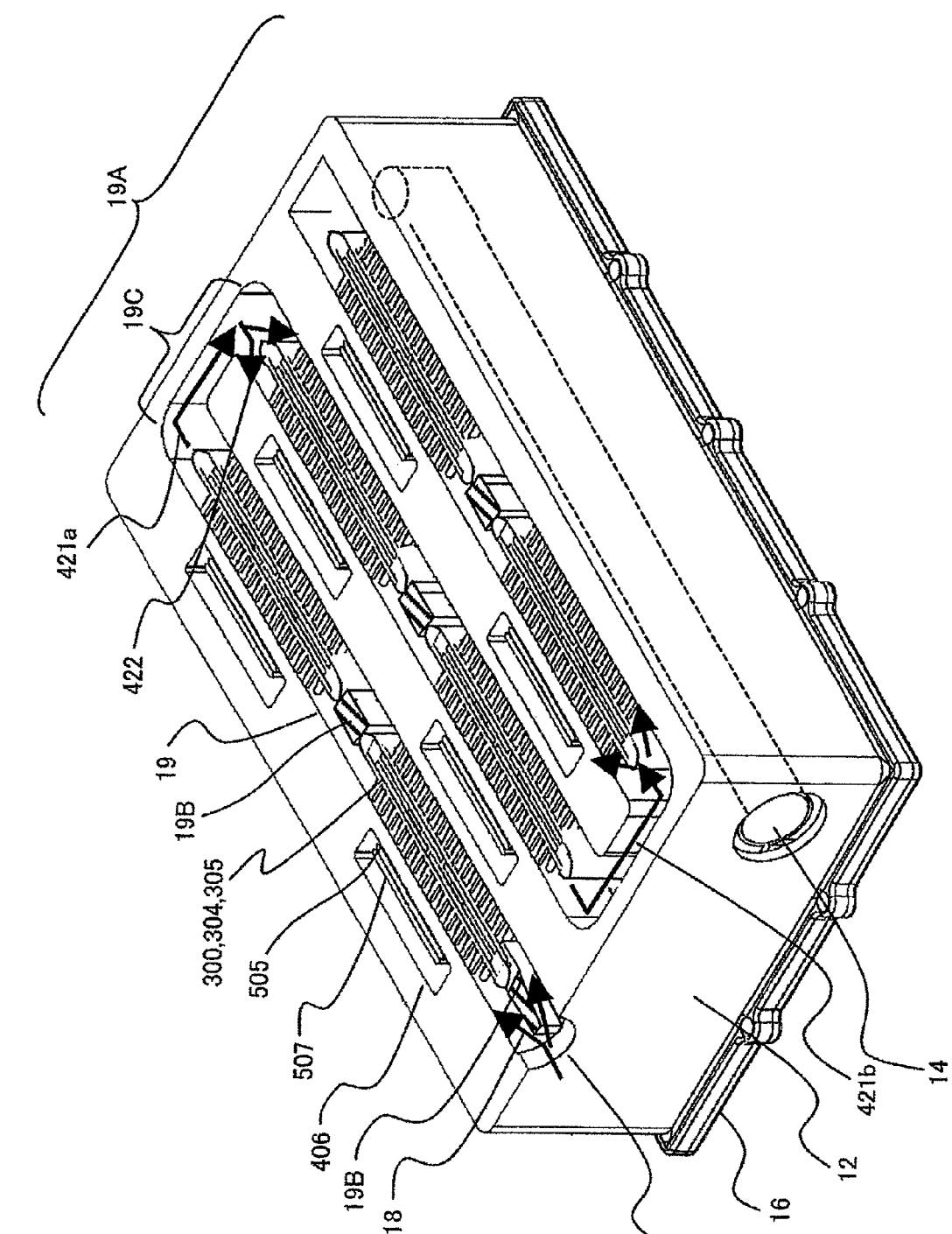
FIG. 15 shows the structure of the water passage in the semiconductor device achieved in the embodiment.
Figure 16:
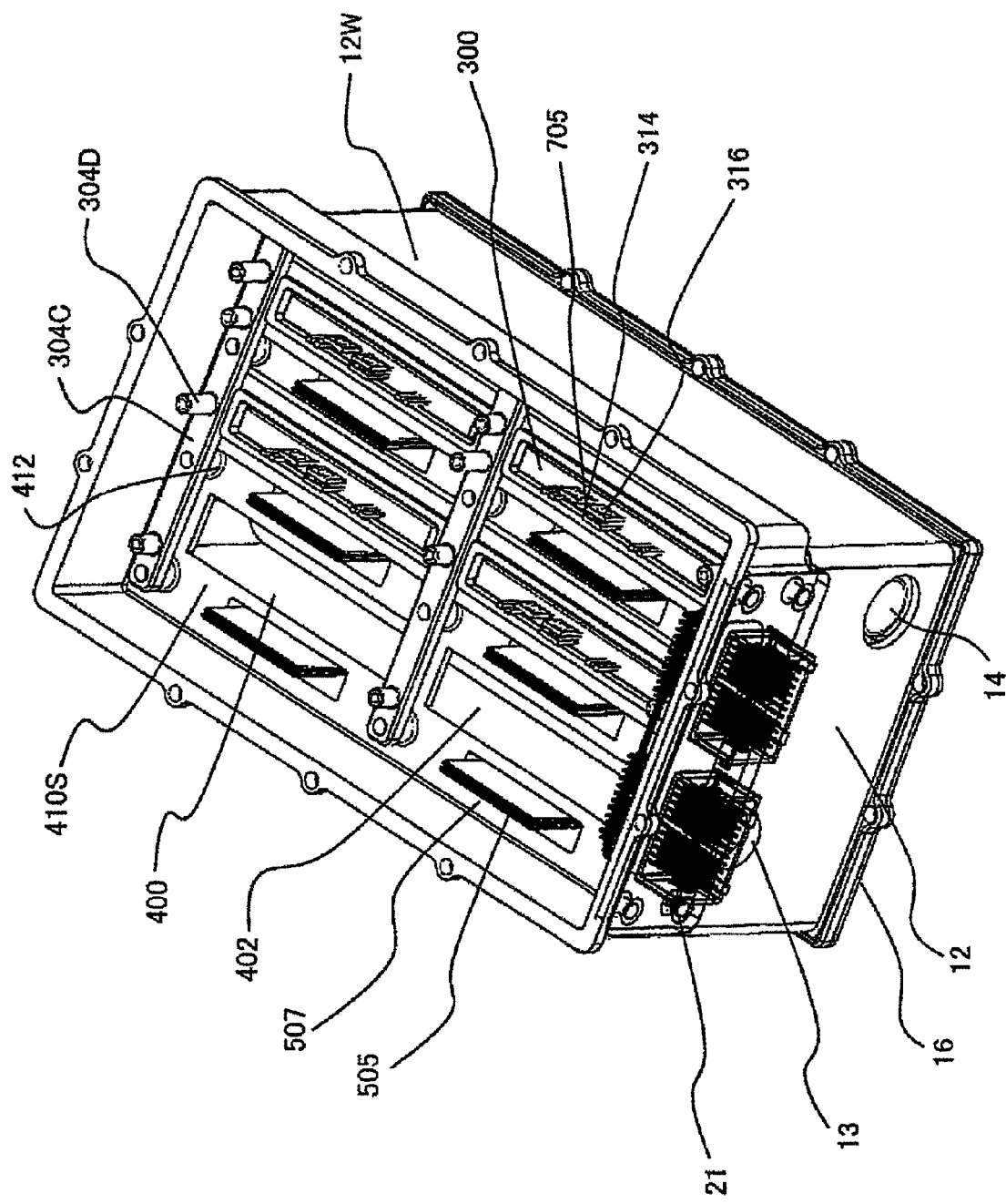
FIG. 16 shows the overall structure of the semiconductor device achieved in the embodiment, with the double-sided cooling-type power modules mounted thereat.

In reference to FIGS. 13 through 15, a power conversion device that includes power semiconductor modules 300 is described. In FIGS. 13 through 15, reference numeral 200 indicates a power conversion device, reference numeral 10 indicates an upper case, reference numeral 11 indicates a metal base plate, reference numeral 12 indicates a casing, reference numeral 13 indicates a cooling water intake pipe, reference numeral 14 indicates a cooling water outlet pipe, reference numeral 420 indicates a flow passage rear lid, reference numeral 16 indicates a lower case, reference numeral 17 indicates an AC terminal case, reference numeral 18 indicates an AC output wiring, reference numeral 19 indicates a cooling water flow passage and reference numeral 20 indicates a control circuit board. Reference numeral 21 indicates a connector via which connection with an external device is achieved, whereas reference numeral 2 indicates a drive circuit board that holds the driver circuit 174. The control circuit board 20, the control circuit 172, a drive circuit board 22 and the driver circuit 174 together constitute a control unit. Reference numeral 300 indicates a power semiconductor module (double-sided electrode module). Three power semiconductor modules are installed in each inverter circuit unit. One set of three power semiconductor modules 300 constitutes an inverter circuit unit 142, whereas another set of three power semiconductor modules 300 constitutes an inverter circuit unit 140. Reference numeral 700 indicates a laminated conductor plate, reference numeral 800 indicates a seal member, reference numeral 304 indicates a CAN-type heat radiating base, reference numeral 314 indicates a DC positive wiring plate, reference numeral 317 indicates a DC negative wiring plate, reference numeral 500 indicates a capacitor module, reference numeral 504 indicates a positive pole-side capacitor terminal, reference numeral 506 indicates a negative pole side capacitor terminal and reference numeral 514 indicates a capacitor cell.

FIG. 13 is a perspective presenting an external view of the power conversion device 200 achieved in the embodiment of the present invention. Components of the power conversion device 200 visible from the outside include the casing 12 with a substantially rectangular upper surface or bottom surface, the cooling water intake pipe 13 and the cooling water outlet pipe 14 disposed at one of the outer surfaces of the casing 12, which is defined by the shorter sides of the casing 12, the upper case 10 that closes off an upper opening of the casing 12 and the lower case 16 that closes off a lower opening of the casing 12. The casing 12 assuming a substantially rectangular shape at the bottom surface thereof or at the upper surface thereof can be mounted at the vehicle with ease. There is an added advantage in that such a casing 12 can be manufactured and, more specifically, mass manufactured with ease. The AC terminal case 17 used to achieve a connection with the motor generators 192 and 194 is disposed along an outer surface of the power conversion device 200 defined by the longer sides of the power conversion device 200. DC output wirings 18 electrically connect the power semiconductor modules 300 with the motor generators 192 and 194.

Connectors 21 are connected to the control circuit board 20 built inside the casing 12. Various signals originating from external sources are transmitted to the control circuit board 20 via the connectors 21. A DC negative pole-side connector terminal portion 510 and a DC positive pole-side connector terminal portion 512 electrically connect the battery 136 to the capacitor module 500. In the embodiment, the connectors 21 are disposed on one of the outer surfaces of the casing 12 defined by the shorter sides of the casing 12. The DC negative pole-side connector terminal portion 510 and the DC positive pole-side connector terminal portion 512 are disposed on the outer surface also defined by the shorter sides of the casing 12, located on the side opposite from the side where the connectors 21 are disposed. In other words, the connectors 21 and the DC negative pole-side connector terminal portion 510 are set apart from each other. This structure improves motor control performance achieved via the control circuit board 20, since noise entering the casing 12 from the DC negative pole-side connector terminal portion 510 to propagate to the connectors 21 is reduced. The DC connector 138 in FIG. 2 corresponds to the DC negative pole-side connector terminal portion 510 and the DC positive pole-side connector terminal portion 512.

FIG. 14 shows the power conversion device achieved in the embodiment of the present invention in a sectional view. A cooling jacket 19A with a flow passage 19 formed therein is disposed to take up mid-space in the casing 12 of the power conversion device. Six openings, i.e., three sets of openings each made up with two openings 400 and 402, are formed one after another along the coolant flow direction at the top of the cooling jacket 19A. The power semiconductor modules 300 are each fixed onto the upper surface of the cooling jacket 19A via the seal member 800. The fins 305 at each power semiconductor module 300 come into direct contact with the cooling medium flowing through the flow passage 19 inside the cooling jacket 19A.

At the lower surface of the cooling jacket 19A, openings 404 are formed along the flow passage 19. The openings 404 are closed off with the flow passage rear lid 420. In addition, an auxiliary converter device 43 is mounted at the lower surface of the cooling jacket 19A and the auxiliary converter device 43 is also cooled with the cooling medium. The auxiliary converter device 43 is locked onto the lower surface of the flow passage rear lid 420 so that heat radiating metal surfaces of the built-in power modules and the like (not shown) face opposite the lower surface of the cooling jacket 19A. The seal member 800 may be constituted with a liquid seal, a resin seal, a rubber O-ring or a gasket. Better assembly efficiency can be achieved in conjunction with a liquid seal in particular.

The lower case 16 is disposed below the cooling jacket 19A. The capacitor module 500 is installed in the lower case 16. The capacitor module 500 is locked onto the inner surface of the bottom of the lower case 16 so that a heat radiating surface of a metal case of the capacitor module comes into contact with the inner surface of the bottom of the lower case 16. This structure allows the power semiconductor modules 300 and the auxiliary converter device 43 to be efficiently cooled via the upper surface and the lower surface of the cooling jacket 19A, which, in turn, makes it possible to provide the power converter device as a whole as a more compact unit. Furthermore, as the casing 12 is cooled and thus the lower case 16, too, is cooled, the heat generated at the capacitor module 500 can be transferred through the lower case 16 and the casing 12 to be discharged into the cooling medium.

Above the power semiconductor modules 300, the laminated conductor plate 700, via which the power semiconductor modules 300 are electrically connected to the capacitor module 500, is disposed. The laminated conductor plate 700, ranging astride input terminals 313 of the individual power semiconductor modules 300, connects the power semiconductor modules 300 in parallel. The laminated conductor plate 700 is constituted with a positive pole-side conductor plate 702 which is connected with a positive conductor plate 507 of the capacitor module 500, a negative conductor plate 704 which is connected with a negative conductor plate 505 at the capacitor module 500 and an insulating sheet disposed between the conductor plates 702 and 704. By disposing the conductor plates 505 and 507 so as to pass through the water passage partitions defining the flow passage 19 winding through the cooling jacket 19A, the wiring length can be reduced, which, in turn, makes it possible to reduce the wiring inductance over the area ranging from each power semiconductor module 300 through the capacitor module 500.

Above the laminated conductor plate 700, the control circuit board 20 and the drive circuit board 22 are disposed. The drive circuit 174 shown in FIG. 2 is mounted on the drive circuit board 22, whereas the control circuit 172 equipped with a CPU, also shown in FIG. 2, is mounted on the control circuit board 20. In addition, the metal base plate 11 is disposed between the drive circuit board 22 and the control circuit board 20. The metal base plate 11 fulfills an electromagnetic shielding function for the groups of circuits mounted on the two boards 20 and 22, and also fulfills a cooling function as the heat generated at the drive circuit board 22 and the control circuit board 20 is discharged via the metal base plate 11.

By disposing the cooling jacket 19A over a central area inside the casing 12, disposing on one side of the cooling jacket 19A, the power semiconductor modules 300 used to drive the motor generators 192 and 194 and disposing, on the other side, the inverter device (power modules) 43 for an auxiliary unit as described above, efficient cooling is achieved by making the most of the limited space, allowing the power conversion device as a whole to be provided as a more compact unit. The cooling jacket 19A, formed as an integrated part of the casing 12 through aluminum casting, will assure a high level of mechanical strength as well as a dependable cooling effect. Furthermore, the casing 12 and the cooling jacket 19A formed as an integrated unit through aluminum casting will assure good heat transfer characteristics and, as a result, the drive circuit board 22, the control circuit board 20 and the capacitor module 500, disposed at positions away from the cooling jacket 19A, can be cooled with better efficiency.

A flexible wiring 23, which passes through the metal base plate 11 and connects the groups of circuits mounted at the drive circuit board 22 and the control circuit board 20, is present at the drive circuit board 22 and the control circuit board 20. This flexible wiring 23, layered into a wiring substrate in advance, is fixed via a bonding material such as solder, onto a wiring pattern formed on the wiring substrate. In addition, electrodes of the flexible wiring 23 are inserted at through holes formed in advance at the wiring substrate and are then fixed in the through holes with a bonding material such as solder. A switching timing signal for an inverter circuit unit generated at the control circuit board 20 is transmitted to the drive circuit board 22 via the flexible wiring 23, and a gate drive signal generated at the drive circuit board 22 in response is applied to the gate electrodes at the individual power modules. The use of such a flexible wiring 23 eliminates the need for connector heads used in the related art, making it possible to improve the efficiency with which components are mounted at the wiring substrate and to reduce the number of required components, which, in turn, allows miniaturization of the inverter unit. In addition, the control circuit board 120 is connected to the connectors 21 via which electrical connection with external devices is achieved. Via a connector 21, signals are exchanged with the onboard battery 136 installed outside the power conversion device 200, i.e., with a lithium battery module. Signals indicating the cell states and the state of charge of the lithium battery, originating from the lithium battery module, are transmitted to the control circuit board 20.

Openings are formed at the upper end and the lower end of the casing 12. The upper opening and the lower opening are respectively closed off with the upper case 10 and the lower case 16 locked onto the casing 12 with fastening members such as screws or bolts. The cooling jacket 19A with the flow passage 19 formed therein is formed so as to take up space substantially at the center of the casing 12 along the heightwise direction. As the openings at the upper surface of the cooling jacket 19A are closed off with the individual power semiconductor modules 300 and the openings at the lower surface of the cooling jacket 19A are closed off with the flow passage rear lid 420, the flow passages 19 are formed inside the cooling jacket 19A. During the assembly process, a water leak test should be conducted so as to assure watertightness at the flow passages 19. Once watertightness is demonstrated through the water leak test, the substrates and the capacitor module 500 are installed through the upper and lower openings of the casing 12. Since the cooling jacket 19A is disposed over a middle area inside the casing 12 and then all the necessary components, inserted through the openings at the upper end and at the lower end of the casing 12, are fixed, better productivity is assured. In addition, since the flow passage 19 is first fully formed, the water leak test is then conducted and finally the remaining components are mounted, high levels of productivity and reliability are achieved.

FIG. 15 is a perspective showing, in a sectional view, the aluminum cast product constituting the casing 12 with the cooling jacket 19A formed as an integrated part thereof, with the cooling water intake pipe and the cooling water outlet pipe mounted thereat. The cooling medium having flowed into the flow passage 19 through the cooling water intake pipe 13 in FIG. 15 then branches into two separate flows along the longer sides of the rectangle, as indicated by arrows 418, before making a U-turn as indicated by an arrow 421a around corners 19C present near a side surface of the rectangle, which is defined by the shorter sides of the rectangle and located on the far side. The cooling medium branches into two flows again, as indicated by arrows 422, to travel along the longer sides of the rectangle before making a U-turn as indicated by an arrow 421b. Subsequently, the cooling medium flows into an outlet pipe disposed at the lower cooling water passage lid 420, makes a U-turn in the outlet pipe before flowing out into the cooling water outlet pipe 14 through an outlet port.

Six openings 400 are formed at the upper surface of the cooling jacket 19A. Each power semiconductor module 300 projects out through the corresponding opening into the cooling medium flow. As the cooling water is divided into two separate flows via the curved portions 304A and branch boundary portions 19B, the extent of pressure loss can be reduced. As the cooling medium is divided into two separate flows via the curved portions 304A of the module case 304 assuming rounded contours, the pressure loss can be reduced, and thus, even as the flow passage winds through S-curves, the extent of increase in pressure loss can be minimized so as to assure better cooling efficiency.

While the invention has been particularly shown and described with respect to preferred embodiments and variations thereof, the present invention is not limited to these examples and it will be understood by those skilled in the art that various changes in form and detail may be made therein without departing from the spirit, scope and teaching of the invention.

The disclosure of the following priority application is herein incorporated by reference:
Japanese Patent Application No. 2009-230136 filed Oct. 2, 2009

The invention claimed is:

1. A semiconductor device, comprising:
a case with an opening formed thereat;
a semiconductor element housed inside the case;
a first conductor plate housed inside the case and positioned at one surface side of the semiconductor element;
a second conductor plate housed inside the case and positioned at another surface side of the semiconductor element;
a positive bus bar electrically connected to the first conductor plate, through which DC power is supplied;
a negative bus bar electrically connected to the second conductor plate, through which DC power is supplied;
a first resin member that closes off the opening at the case; and
a second resin member that seals the semiconductor element, the first conductor plate and the second conductor plate and is constituted of a material other than a material constituting the first resin member, wherein:
the positive bus bar and the negative bus bar extend from inside the case toward outside the case via the opening, the first resin member fills an area between the positive bus bar and the negative bus bar and the second resin member fills an area between the semiconductor element and the first resin member.

2. A semiconductor device, comprising:
a case with an opening formed thereat;
a semiconductor element housed inside the case;
a first conductor plate housed inside the case and positioned at one surface side of the semiconductor element;
a second conductor plate housed inside the case and positioned at another surface side of the semiconductor element;
a positive bus bar electrically connected to the first conductor plate, through which DC power is supplied;
a negative bus bar electrically connected to the second conductor plate, through which DC power is supplied; and
a signal line through which a control signal for controlling the semiconductor element is transmitted, wherein:
the positive bus bar, the negative bus bar and the signal line extend from inside the case toward outside the case via the opening at the case;
the semiconductor device further comprises a first resin member disposed at the opening of the case so as to close off the opening, with the positive bus bar, the negative bus bar and the signal line supported by the first resin member; and
the semiconductor device further comprises a second resin member constituted of a material different from a material constituting the first resin member, which fills an area between the semiconductor element and the first resin member within the case.

3. A semiconductor device according to claim 1, wherein:
the positive bus bar and the negative bus bar are disposed next to each other so as to face opposite each other, and an area between the positive bus bar and the negative bus bar is filled with the first resin member; and
the first resin member closing off the opening includes a projection projecting out toward the case with the opening formed thereat.

4. A semiconductor device according to claim 3, wherein:
a front end of the projection formed at the first resin member, in tight contact with an inner surface of the case, assumes a compressed shape.

5. A semiconductor device according to claim 1, wherein:
the semiconductor element and the first conductor plate or the semiconductor element and the second conductor plate are electrically connected with each other via a solder layer, and the first resin member is constituted of a material with a fusing temperature higher than a fusing temperature of the solder.

6. A semiconductor device according to claim 1, wherein:
a fixing portion, which is to fix the first resin member with the second resin member, is disposed at the first resin member on a side toward the semiconductor element, and the fixing portion includes a hole or a recess/protrusion pattern.

7. A power semiconductor module, comprising:
a power module case that includes a first surface and a second surface facing opposite each other and achieving a large width, and an opening formed at a surface present between the first surface and the second surface;
an upper arm switch element and a lower arm switch element housed inside the case, respectively constituting an upper arm circuit and a lower arm circuit of an inverter;
a first conductor plate housed inside the case, which is positioned at one surface side of the upper arm switch element and is electrically connected with the one surface of the upper arm switch element;
a second conductor plate housed inside the case, which is positioned at another surface side of the lower arm switch element and is electrically connected with the another surface of the lower arm switch element;
a first conductor that connects in series the upper arm switch element and the lower arm switch element by electrically connecting another surface of the upper arm switch element and one surface of the lower arm switch element;
a positive bus bar and a negative bus bar through which DC power is supplied to the upper arm switch element and the lower arm switch element connected in series; and
a plurality of signal lines through which control signals for controlling the upper arm switch element and the lower arm switch element are transmitted, wherein:
the positive bus bar, the negative bus bar and the plurality of signal lines extend from inside the power module case toward outside the power module case via the opening at the power module case;
the power semiconductor module further comprises a first mold member constituted of a first resin member and disposed at the opening so as to close off the opening, with the plurality of signal lines being fixed in place with the first mold member, and the positive bus bar and the negative bus bar being supported via the first mold member so as to sustain a positional relationship whereby the positive bus bar and the negative bus bar, disposed next to each other, face opposite each other; and
a space unoccupied by the upper arm switch element, the lower arm switch element, the first conductor plate, the second conductor plate and the first conductor is filled with a second resin member constituted of a material different from a material of the first resin member.

8. A power semiconductor module according to claim 7, wherein:
fins for heat dissipation are provided at outside of the first surface and the second surface of the power module case; and
the first conductor plate and the second conductor plate are disposed inside relative to the first surface and the second surface so as to face opposite the first surface and the second surface respectively, and the first conductor plate and the second conductor plate are fixed to inner sides of the first surface and the second surface of the power module case via insulating sheets.

9. A power semiconductor module according to claim 7, wherein:
a projection projecting out toward an inner surface of the power module case is formed at an outer side surface of the first mold member facing opposite the inner surface of the power module case.

10. A power semiconductor module according to claim 7, wherein:
an AC bus bar, which extends from the inside of the power module case through the opening toward the outside of the power module case, is disposed;
the AC bus bar is electrically connected with the first conductor via which the upper arm switch element and the lower arm switch element are connected in series;
the first conductor plate and the positive bus bar are located on a side toward the first surface of the power module case;
the second conductor plate and the negative bus bar are located on a side toward the second surface of the power module case;
the power semiconductor module further comprises a third conductor plate and a fourth conductor plate;
the first conductor plate and the third conductor plate are disposed so as to face opposite each other across the upper arm switch element;
the second conductor plate and the fourth conductor plate are disposed so as to face opposite each other across the lower arm switch element;
the first conductor plate and the fourth conductor plate are fixed to an inner side of the first surface of the power module case via an insulating sheet;
the second conductor plate and the third conductor plate are fixed to the inner side of the second surface of the power module case via an insulating sheet; and
the third conductor plate and the fourth conductor plate are electrically connected with each other via the first conductor.

11. A power semiconductor module according to claim 10, wherein:
the first conductor plate and the fourth conductor plate are disposed next to each other along a second direction intersecting a first direction along which the positive bus bar or the negative bus bar extends from the inside of the power module to the outside of the power module; and
the third conductor plate and the second conductor plate are disposed next to each other along the second direction.

12. A power semiconductor module according to claim 11, wherein:
the upper arm circuit includes a plurality of upper arm switch elements connected in parallel;
the lower arm circuit includes a plurality of lower arm switch elements connected in parallel;
the plurality of upper arm switch elements are disposed next to each other along the second direction between the first conductor plate and the third conductor plate; and
the plurality of lower arm switch elements are disposed next to each other along the second direction between the fourth conductor plate and the second conductor plate.

13. A power conversion device, comprising:
a cooling unit that forms a flow passage through which a cooling medium flows;
a plurality of power semiconductor modules disposed along the flow passage at the cooling unit; and
a capacitor module for smoothing, wherein:
the power semiconductor modules each comprise:
a power module case that includes a first surface and a second surface facing opposite each other and achieving a large width, and an opening formed at a surface present between the first surface and the second surface;
an upper arm switch element and a lower arm switch element housed inside the case, respectively constituting an upper arm circuit and a lower arm circuit of an inverter;
a first conductor plate housed inside the case, which is positioned at one surface side of the upper arm switch element and is electrically connected with the one surface of the upper arm switch element;
a second conductor plate housed inside the case, which is positioned at another surface side of the lower arm switch element and is electrically connected with the another surface of the lower arm switch element;
a first conductor that connects in series the upper arm switch element and the lower arm switch element by electrically connecting another surface of the upper arm switch element and one surface of the lower arm switch element;

a positive bus bar and a negative bus bar through which DC power is supplied to the upper arm switch element and the lower arm switch element connected in series; and a plurality of signal lines through which control signals for controlling the upper arm switch element and the lower arm switch element are transmitted, wherein:

the positive bus bar, the negative bus bar and the plurality of signal lines extend from inside the power module case toward outside the power module case via the opening at the power module case;

the power semiconductor module further comprises a first mold member constituted of a first resin member and disposed at the opening so as to close off the opening, with the plurality of signal lines being fixed in place with the first mold member and the positive bus bar and the negative bus bar being supported via the first mold member so as to sustain a positional relationship whereby the positive bus bar and the negative bus bar, disposed next to each other, face opposite each other; and a space unoccupied by the upper arm switch element, the lower arm switch element, the first conductor plate, the second conductor plate and the first conductor is filled with a second resin member constituted of a material different from a material of the first resin member.

14. A power conversion device according to claim 13, wherein:

in each of the power semiconductor modules, fins for heat dissipation are provided at outside of the first surface and the second surface of each power module case; and the first conductor plate and the second conductor plate are disposed inside relative to the first surface and the second surface so as to face opposite the first surface and the second surface respectively, and the first conductor plate and the second conductor plate are fixed to inner sides of the first surface and the second surface of the power module case via insulating sheets.

15. A power conversion device according to claim 13, wherein:

in each of the power semiconductor modules, a projection projecting out toward an inner surface of the power module case is formed at an outer side surface of the first mold member facing opposite the inner surface of the power module case.

16. A power conversion device according to claim 13, wherein:

in each of the power semiconductor modules, an AC bus bar, which extends from the inside of the power module case through the opening toward the outside of the power module case, is provided;

the AC bus bar is electrically connected with the first conductor via which the upper arm switch element and the lower arm switch element are connected in series;

the first conductor plate and the positive bus bar are located on a side toward the first surface of the power module case;

the second conductor plate and the negative bus bar are located on a side toward the second surface of the power module case;

a third conductor plate and a fourth conductor plate are further provided;

the first conductor plate and the third conductor plate are disposed so as to face opposite each other across the upper arm switch element;

the second conductor plate and the fourth conductor plate are disposed so as to face opposite each other across the lower arm switch element;

the first conductor plate and the fourth conductor plate are fixed to an inner side of the first surface of the power module case via an insulating sheet;

the second conductor plate and the third conductor plate are fixed to the inner side of the second surface of the power module case via an insulating sheet; and the third conductor plate and the fourth conductor plate are electrically connected with each other via the first conductor.

17. A power conversion device according to claim 16, wherein:

in each of the power semiconductor modules, the first conductor plate and the fourth conductor plate are disposed next to each other along a second direction intersecting a first direction along which the positive bus bar or the negative bus bar extends from the inside of the power module to the outside of the power module; and the third conductor plate and the second conductor plate are disposed next to each other along the second direction.

18. A power conversion device according to claim 17, wherein:

in each of the power semiconductor modules, the upper arm circuit includes a plurality of upper arm switch elements connected in parallel;

the lower arm circuit includes a plurality of lower arm switch elements connected in parallel;

the plurality of upper arm switch elements are disposed next to each other along the second direction between the first conductor plate and the third conductor plate; and the plurality of lower arm switch elements are disposed next to each other along the second direction between the fourth conductor plate and the second conductor plate.

19. A semiconductor device according to claim 2, wherein:

the positive bus bar and the negative bus bar are disposed next to each other so as to face opposite each other, and an area between the positive bus bar and the negative bus bar is filled with the first resin member; and the first resin member closing off the opening includes a projection projecting out toward the case with the opening formed thereat.

20. A semiconductor device according to claim 2, wherein:

a fixing portion, which is to fix the first resin member with the second resin member, is disposed at the first resin member on a side toward the semiconductor element, and the fixing portion includes a hole or a recess/protrusion pattern.

* * * * *